US007659625B2

(12) United States Patent
Lim et al.

(10) Patent No.: US 7,659,625 B2
(45) Date of Patent: Feb. 9, 2010

(54) CONTACT STRUCTURE OF A WIRES AND METHOD MANUFACTURING THE SAME, AND THIN FILM TRANSISTOR SUBSTRATE INCLUDING THE CONTACT STRUCTURE AND METHOD MANUFACTURING THE SAME

(75) Inventors: Seung-Taek Lim, Seoul (KR); Mun-Pyo Hong, Seongnam (KR); Nam-Seok Roh, Seongnam (KR); Young-Joo Song, Suwon (KR); Sang-Ki Kwak, Suwon (KR); Kwon-Young Choi, Seoul (KR); Keun-Kyu Song, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/333,973

(22) Filed: Dec. 12, 2008

(65) Prior Publication Data
US 2009/0096105 A1 Apr. 16, 2009

Related U.S. Application Data

(63) Continuation of application No. 11/947,204, filed on Nov. 29, 2007, now abandoned, which is a continuation of application No. 10/475,903, filed as application No. PCT/KR02/00582 on Apr. 2, 2002, now Pat. No. 7,303,987.

(30) Foreign Application Priority Data
Apr. 26, 2001 (KR) ............................ 2001/0022648

(51) Int. Cl.
*H01L 23/48* (2006.01)
(52) U.S. Cl. ...................................... 257/750; 257/734
(58) Field of Classification Search ................. 257/734, 257/750
See application file for complete search history.

(56) References Cited

U.S. PATENT DOCUMENTS 6,414,730 B1 * 7/2002 Akamatsu et al. ............. 349/43

FOREIGN PATENT DOCUMENTS

| JP | 11-214504 | 8/1999 |
| JP | 11-337976 | 12/1999 |
| JP | 2000-164886 | 6/2000 |
| JP | 2001-0666639 | 3/2001 |
| JP | 2001-093598 | 4/2001 |

* cited by examiner

*Primary Examiner*—Douglas M Menz
(74) *Attorney, Agent, or Firm*—Innovation Counsel LLP

(57) ABSTRACT

In a method of fabricating a thin film transistor array substrate for a liquid crystal display, a gate line assembly is formed on a substrate with a chrome-based under-layer and an aluminum alloy-based over-layer while proceeding in the horizontal direction. The gate line assembly has gate lines, and gate electrodes, and gate pads. A gate insulating layer is deposited onto the insulating substrate such that the gate insulating layer covers the gate line assembly. A semiconductor layer and an ohmic contact layer are sequentially formed on the gate insulating layer. A data line assembly is formed on the ohmic contact layer with a chrome-based under-layer and an aluminum alloy-based over-layer. The data line assembly has data lines crossing over the gate lines, source electrodes, drain electrodes, and data pads. A protective layer is deposited onto the substrate, and patterned to thereby form contact holes exposing the drain electrodes, the gate pads, and the data pads. The sidewall of the under-layers for the gate line assembly and the data line assembly is exposed through the contact holes. An IZO-based layer is deposited onto the substrate, and patterned to thereby form pixel electrodes, subsidiary gate pads, and subsidiary data pads. The pixel electrodes are connected to the sidewall of the drain electrodes, and the subsidiary gate and data pads are connected to the sidewall of the gate and the data pads.

10 Claims, 33 Drawing Sheets

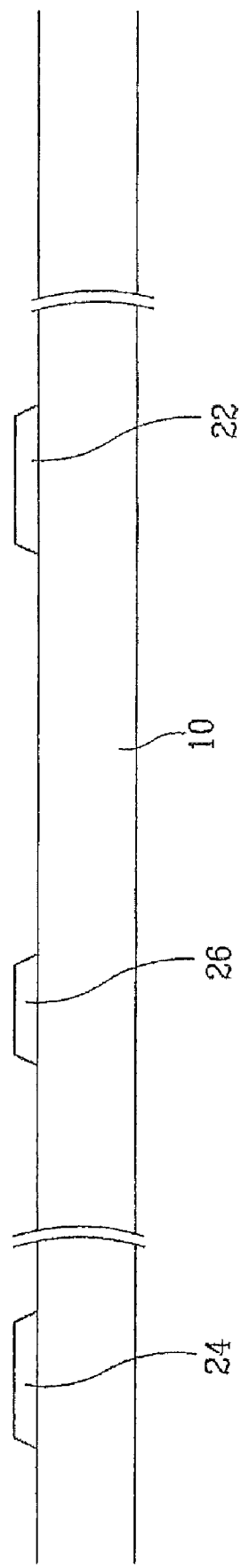

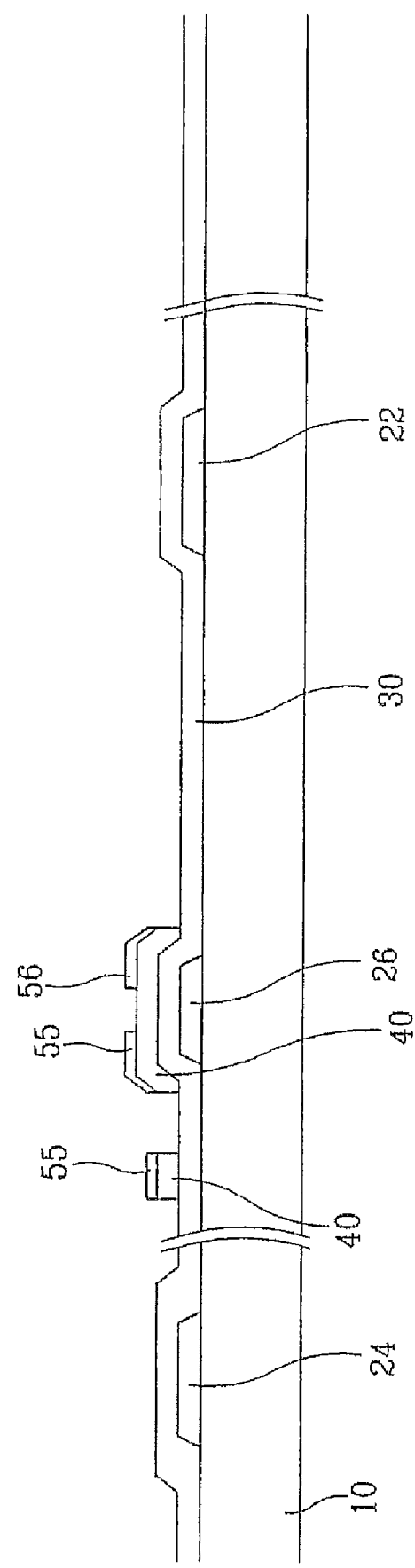

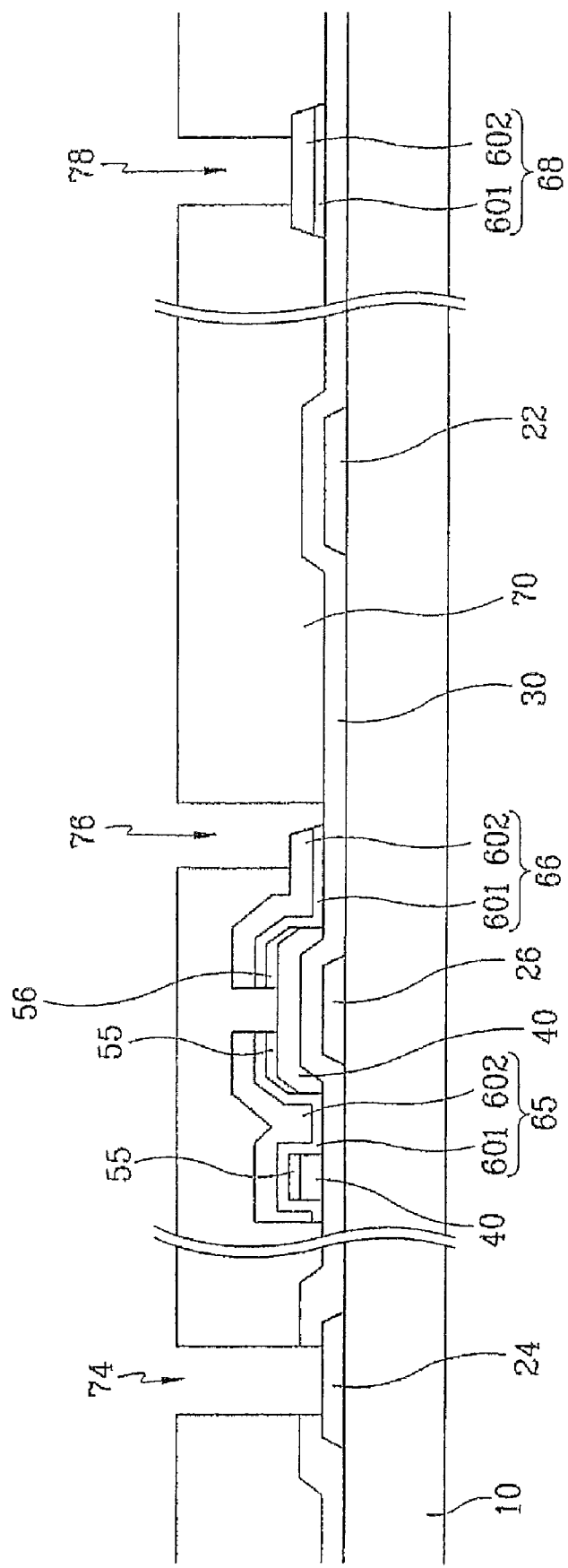

FIG. 10

| | | | Deposition temperature for Al-Nd | Deposition condition for insulating layer | Cleaning | Deposition condition for insulating layer | Etching condition for insulating layer | 10*10 First pattern | 10*10 Second pattern | 7*7 First pattern | 7*7 Second pattern | 4*4 First pattern | 4*4 Second pattern |
|---|---|---|---|---|---|---|---|---|---|---|---|---|---|
| Deposition condition for insulating layer | Deposition condition for protective layer 150°C | 2000Å | | | | | PE 63" | 4.0G | 330K | 10G | 348K | 44G | 807K |
| | | 3000Å | | | | | | 3.4G | 517K | 13G | 664K | 85G | 1.2M |
| | Deposition condition for protective layer 310°C | 2000Å | | X | 35" | | PE 63" | 426M | 62K | 1.0G | 42K | 4.1G | 81K |
| | | 4000Å | | | | | | 634M | 39K | 1.5G | 53K | 5.4G | 101K |
| | Deposition condition for protective layer 235°C | 2000Å | | | | | PE 63" | 66M | 88K | 126M | 91K | 327M | 168K |
| | | 3000Å | | | | | | 60K | 117K | 409M | 120K | 1.1G | 225K |
| | Deposition condition for protective layer 310°C | 2000Å | 150°C | 3000Å | | | PE 68" | 1.5G | 96K | 3.7G | 134K | 13G | 315K |
| | | 4000Å | | 3000Å | | | | 2.2G | 127K | 5.12G | 180K | 18G | 594K |
| Etching condition for amorphous silicon layer | Thickness of etching | 1500Å | | | | | PE 68" | 39M | 20K | 101M | 28K | 430M | 72K |
| | | 3000Å | | | | | | 27M | 16K | 65M | 21K | 295M | 41K |
| Etching condition for insulating layer | PE | 68" | | | | | ICP Bias 1000W | 80M | 37K | 230M | 50K | 1.3G | 123K |
| | ICP | | | | | | ICP Bias 400W | 2.5G | 23K | 7.9G | 37K | 55G | 74K |
| Cleaning | Time for Cleaning | X | | | X | Deposition condition for protective layer 310°C 2000Å | PE 68" | 1.2G | 32K | 2.5G | 40K | 10G | 100K |
| | | 70" | | | 70" | | | 5.3M | 14K | 12M | 18K | 48M | 30K |
| Deposition temperature for Al-Nd | Deposition temperature for Al-Nd | 50°C | 50°C | | 35" | | | 1.2G | 29K | 2.7G | 44K | 11G | 113K |
| | | | | | | | | 308M | 20K | 660M | 23K | 2.9G | 32K |

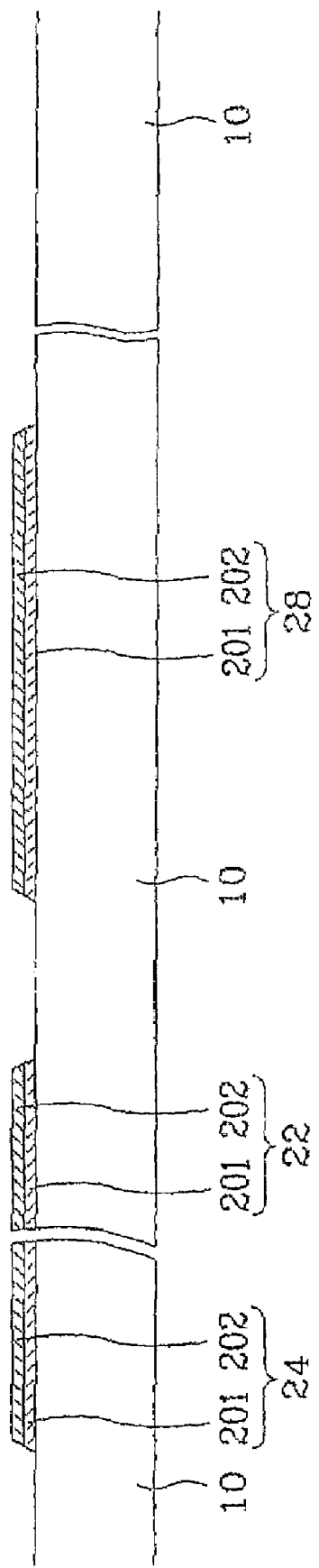

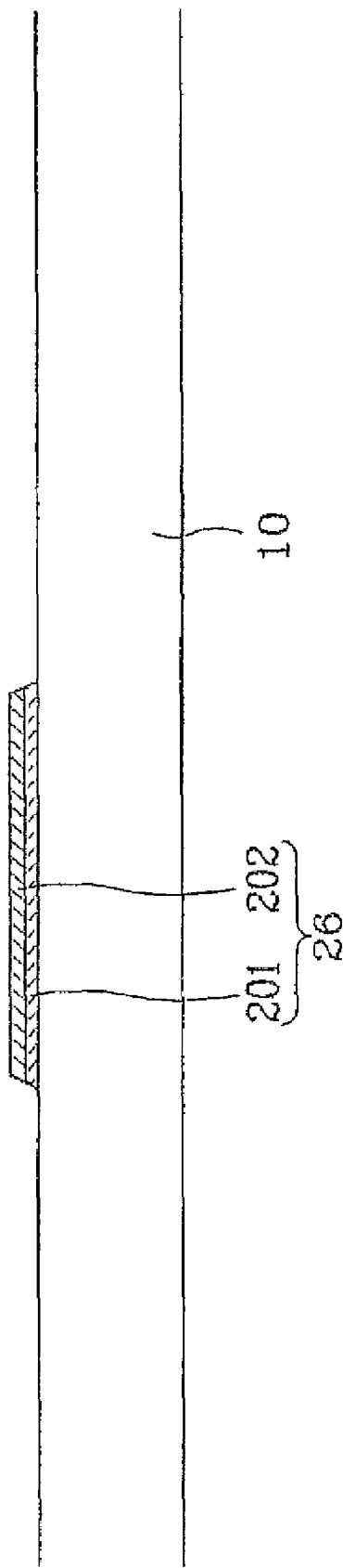

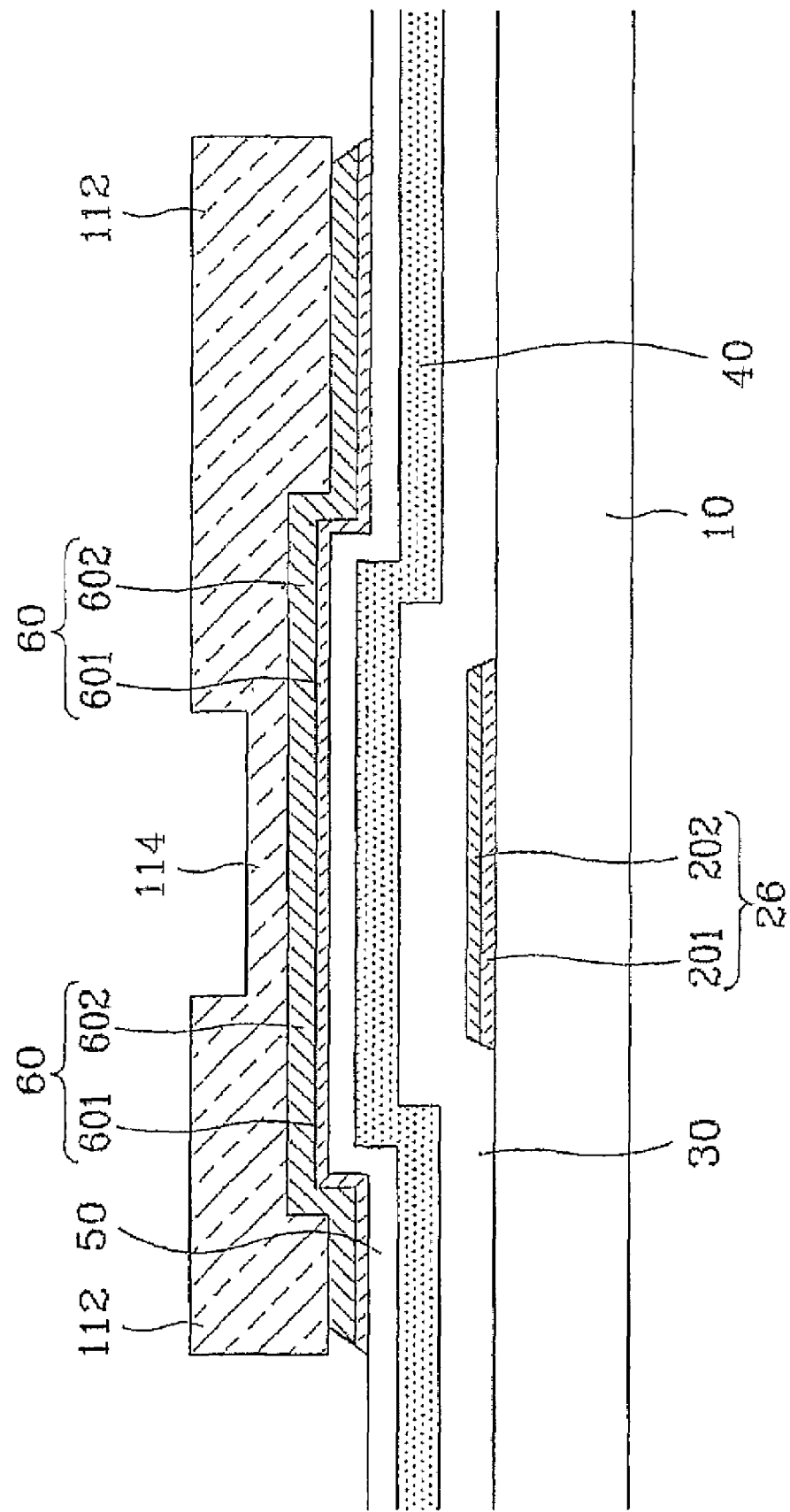

CONTACT STRUCTURE OF A WIRES AND METHOD MANUFACTURING THE SAME, AND THIN FILM TRANSISTOR SUBSTRATE INCLUDING THE CONTACT STRUCTURE AND METHOD MANUFACTURING THE SAME

CROSS-REFERENCE TO RELATED APPLICATION

This patent application is a continuation application of U.S. application Ser. No. 11/947,204, filed Nov. 29, 2007 now abandoned, which is a continuation application of U.S. application Ser. No. 10/475,903, filed Jul. 1, 2004, U.S. Pat. No. 7,303,987, issued on Dec. 4, 2007 which claims priority of PCT Application No.: PCT/KR02/00582, filed Apr. 2, 2002, the contents of which are hereby incorporated by reference herein in their entirety.

BACKGROUND (a) Field of the Invention

The present invention relates to a contact structure wiring line for a thin film transistor array substrate, and a method of fabricating the same.

(b) Description of the Related Art

Generally, a wiring line assembly is formed at a semiconductor device to transmit signals while involving the requirement of minimization in signal delay.

In order to minimize the signal delay, the wiring line assembly is usually formed with a low resistance metallic material such as aluminum and aluminum alloy. However, as the aluminum-based metallic material involves weak physico-chemical characteristic, erosion is liable to be made at the wiring line assembly when it contacts other conductive materials at the contact area, and this deteriorates the performance characteristics of the semiconductor device. Particularly in the case of a liquid crystal display, as the pixel electrode is formed with a transparent conductive material such as indium tin oxide (ITO), the aluminum-based layer being in contact with the ITO-based electrode is liable to be eroded. In order to solve such a problem, it has been proposed that indium zinc oxide (IZO) exhibiting good contact characteristic with the aluminum-based metallic material should be used to form the pixel electrode. However, in this case, the contact resistance becomes increased at the contact area.

SUMMARY

It is an object of the present invention to provide a wiring line contact structure which is formed with a low resistance material while bearing a low resistance contact characteristic.

It is another object of the present invention to provide a wiring line contact structure for a thin film transistor array substrate which involves excellent contact characteristic.

These and other objects may be achieved by the following features. A wiring line assembly is formed with an aluminum or aluminum alloy-based layer and another conductive layer. The sidewall of the wiring line assembly is exposed through a contact hole at the contact area, or an opening portion is formed at one of the layers while exposing the other layer.

An IZO-based layer is connected to the wiring line assembly through the contact hole. In order to prevent the IZO-based layer from being cut due to the stepped difference at the contact area, the distance between the boundary of the contact hole and the boundary of the wiring line assembly is established to be 2 µm or less.

According to one aspect of the present invention, in a method of forming a wiring line contact structure, a wiring line assembly is formed on a substrate with a first conductive layer.

An insulating layer is deposited onto the wiring line assembly such that the insulating layer covers the wiring line assembly. The insulating layer is patterned to thereby form a contact hole exposing the sidewall of the wiring line assembly. A second conductive layer is formed such that the second conductive layer contacts the sidewall of the wiring line assembly through the contact hole.

The first conductive layer is formed with an over-layer based on aluminum or aluminum alloy, and an under-layer based on molybdenum, molybdenum alloy or chrome. The second conductive layer is formed with IZO.

The distance between the boundary of the contact hole and the boundary of the wiring line assembly is established to be 2 µm or less.

According to another aspect of the present invention, in a method of forming a wiring line contact structure, a wiring line assembly is formed on a substrate such that the wiring line assembly has an opening portion. An insulating layer is deposited onto the substrate such that the insulating layer covers the wiring line assembly. The insulating layer is patterned to thereby form a contact hole exposing the opening portion. A first conductive layer is formed on the insulating layer such that the first conductive layer contacts the wiring line assembly through the contact hole.

The wiring line assembly is formed with a second conductive layer having an over-layer based on aluminum or aluminum alloy, and an under-layer based on molybdenum, molybdenum alloy or chrome. The first conductive layer is formed with IZO. The opening portion is formed only at the over-layer while bearing an area of 4×4 µm or less. The over-layer and the under-layer may be formed through photolithography using one photoresist pattern.

According to still another aspect of the present invention, a thin film transistor array substrate includes a gate line assembly formed on an insulating substrate. A gate insulating layer covers the gate line assembly. A semiconductor layer is formed on the gate insulating layer. A data line assembly is formed on the gate insulating layer with the semiconductor layer. A protective layer covers the data line assembly. A transparent conductive pattern is formed on the gate insulating layer or the protective layer. The conductive pattern contacts the sidewall of the gate line assembly and the data line assembly through first contact holes formed at the gate insulating layer or the protective layer.

The gate line assembly or the data line assembly is formed with an under-layer based on chrome, molybdenum or molybdenum alloy, and an over-layer based on aluminum or aluminum alloy. The gate insulating layer and the protective layer are formed with silicon nitride. The transparent conductive pattern is formed with IZO.

The gate line assembly has gate lines proceeding in the horizontal direction, gate electrodes connected to the gate lines, and gate pads connected to the gate lines to receive scanning signals from the outside and transmit the scanning signals to the gate lines. The data line assembly has data lines proceeding in the vertical direction, source electrodes connected to the data lines, drain electrodes separated from the source electrodes while facing the source electrodes around the gate electrodes, and data pads connected to the data lines to receive picture signals from the outside and transmit the picture signals to the data lines. The sidewall of the drain electrodes is exposed through the first contact holes.

The protective layer has second contact holes exposing the data pads, and third contact holes exposing the gate pads together with the gate insulating layer. The area of the first to the third contact holes is established to be 4×4 μm-10×10 μm. The transparent conductive pattern is formed with pixel electrodes contacting the sidewall of the drain electrodes, and subsidiary data and gate pads connected to the data and the gate pads through the second and the third contact holes. The sidewall of the data pad or the gate pad is exposed through the second contact hole or the third contact hole, and the subsidiary data pad or the subsidiary data pad contacts the sidewall of the data pad or the gate pad.

In a method of fabricating the thin film transistor array substrate for a liquid crystal display, a gate line assembly is on an insulating substrate. The gate line assembly has gate lines and gate electrodes connected to the gate lines. A gate insulating layer is deposited onto the insulating substrate such that the gate insulating layer covers the gate line assembly. A semiconductor layer is formed on the gate insulating layer. A data line assembly is formed on the gate insulating layer with the semiconductor layer. The data line assembly has data lines crossing over the gate lines, source electrodes connected to the data lines while being positioned close to the gate electrodes, and drain electrodes facing the source electrodes around the gate electrodes. A protective layer is deposited onto the substrate, and patterned to thereby form contact holes exposing the sidewall of the drain electrodes. Pixel electrodes are formed on the protective layer such that the pixel electrodes contact the sidewall of the drain electrodes through the contact holes.

The data line assembly and the semiconductor layer are formed through photolithography using a photoresist pattern differentiated in thickness. The photoresist pattern has a first portion with a first thickness, a second portion with a second thickness greater than the first thickness, and a third portion with no thickness.

In the photolithography process, the photoresist pattern is formed using a photo-mask with a first region bearing a predetermined light transmission, a second region bearing a light transmission lower than the light transmission of the first region, and a third region bearing a light transmission higher than the light transmission of the first region. The first portion of the photoresist pattern is placed between the source and the drain electrodes, and the second portion of the photoresist pattern is placed over the data line assembly.

The photo-mask has a semitransparent film or a slit pattern bearing a slit width smaller than the light decomposition capacity of the light exposing device to control the light transmission of the first to the third regions in a different manner. The thickness of the first portion is established to be ½ or less with respect to the thickness of the second portion.

An ohmic contact layer may be formed between the semiconductor layer and the data line assembly. The data line assembly, the ohmic contact layer and the semiconductor layer are formed using one mask.

DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 6B is a cross sectional view of the thin film transistor array substrate taken along the VIb-VIb' line of FIG. 6A;

FIG. 7B is a cross sectional view of the thin film transistor array substrate taken along the VIIb-VIIb' line of FIG. 7A illustrating the processing step following that illustrated in FIG. 6B;

FIG. 9B is a cross sectional view of the thin film transistor array substrate taken along the IXb-IXb' line of FIG. 9A illustrating the processing step following that illustrated in FIG. 8B;

FIG. 10 is a table illustrating the contact resistance of test patterns formed at the periphery of the thin film transistor array substrate shown in FIG. 4;

FIGS. 14B and 14C are cross sectional views of the thin film transistor array substrate taken along the XIVb-XIVb' line and XIVc-XIVc' line of FIG. 14A;

FIGS. 17A to 19B sequentially illustrate the steps of fabricating the thin film transistor array substrate following that illustrated in FIGS. 16B and 16C;

DESCRIPTION OF THE EMBODIMENT(S)

Preferred embodiments of this invention will be explained with reference to the accompanying drawings.

FIGS. 1A to 3E illustrate a wiring line contact structure according to the present invention. Specifically, FIGS. 1A, 2A, 2C, 3A to 3E are plan views of the wiring line contact structure, and FIGS. 1B, 2B and 2D are cross sectional views of the wiring line contact structure taken along the Ib-Ib' line of FIG. 1A, the IIb-IIb' line of FIG. 2A, and the IId-IId' line of FIG. 2C.

In view of minimization in the signal delay, an aluminum or aluminum alloy-based metallic material bearing a low resistivity of 15 μΩcm or less is well adapted for use in forming a signal transmission line for a semiconductor device. The signal transmission line is connected to other conductive layers to receive the relevant signals and transmit them to the required place. As the signal transmission line contacts the neighboring conductive layers, the contact resistance should be reduced as much as possible.

Figure 1A:
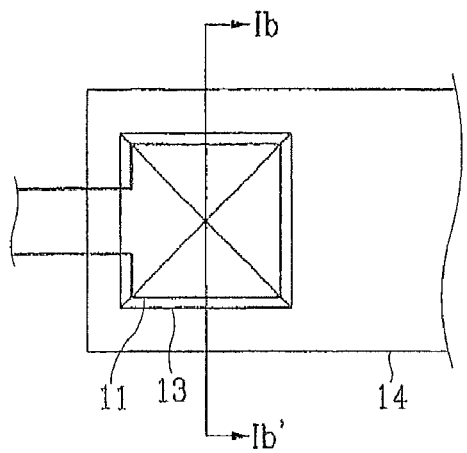
FIGS. 1A to 3E illustrate a wiring line contact structure according to the present invention.
Figure 1B:
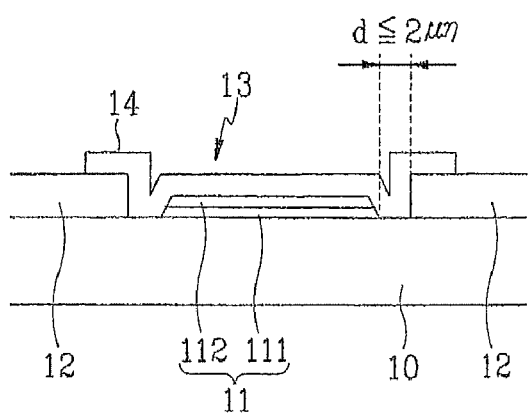

For this purpose, as shown in FIGS. 1A and 1B, a first conductive layer is deposited onto a substrate 10 such that it has an under-layer 111 bearing a low contact resistance with respect to IZO, such as molybdenum, molybdenum alloy and chrome, and an over-layer 112 bearing a low resistance, such as aluminum or aluminum alloy, and patterned to thereby form a wiring line assembly 11. An insulating layer 12 is then deposited onto the substrate 10 such that it covers the wiring line assembly 11. Thereafter, the insulating layer 12 is patterned such that it bears a contact hole 13 exposing the wiring line assembly 11. A second conductive layer 14 is formed on the insulating layer 12 with IZO such that it is directly connected to the wiring line assembly 11 through the contact hole 13. The sidewall of the wiring line assembly 11, particularly the sidewall of the under-layer 111, is sufficiently exposed to the outside through the contact hole 13 such that the IZO-based layer 14 contacts the under-layer 111 in a sufficient manner. The contact hole 13 is preferably formed such that the distance d between the sidewall of the wiring line assembly 11 exposed through the contact hole 13 and the sidewall of the contact hole 13 positioned close thereto is established to be 2 μm or less. This is to prevent the second conductive layer 14 from being cut due to the stepped difference of the contact hole 13.

Figure 2A:
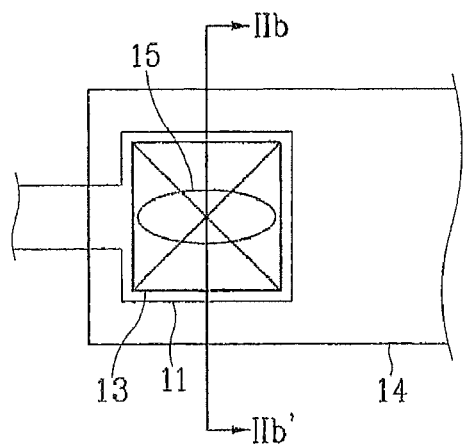
Figure 2B:
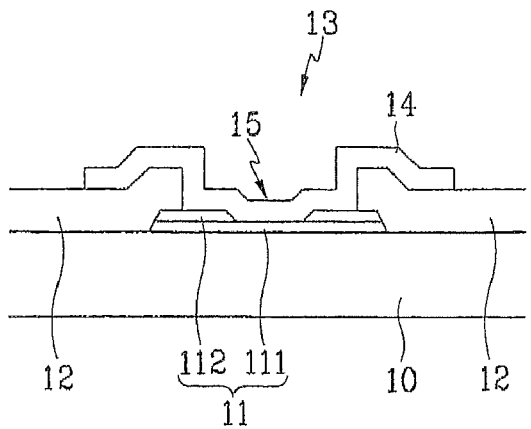

Furthermore, as shown in FIGS. 2A and 2B, at least one opening portion 15 may be formed at the over-layer 112 of the wiring line assembly 11, and the insulating layer 12 covering the wiring line assembly 11 is patterned to thereby form a contact hole 13 exposing the opening portion 15. Thereafter, a second conductive layer 14 is formed on the insulating layer 12 such that it contacts the under-layer 111 of the wiring line assembly 11 through the opening portion 15. It is preferable that the opening portion 15 is established to bear an area of 4×4 μm or less. As the opening portion 15 bears such a small dimension, only one mask may be used in forming the over-layer 112 and the under-layer 111. That is, when the over-layer 112 and the under-layer 111 differentiated in shape are patterned, the over-layer 112 is etched using a photoresist pattern as an etching mask. Thereafter, the under-layer 601 is etched using the remaining photoresist pattern or the over-layer 602 as an etching mask. As the opening portion 15 bears a small area of 4×4 ran or less, the etching speed becomes slower at the opening portion 15. Therefore, the under-layer 111 is not completely removed while being partially left over. In this way, the over-layer 112 and the under-layer 111 differentiated in shape can be formed through the photolithography process using one photoresist pattern.

Figure 2C:
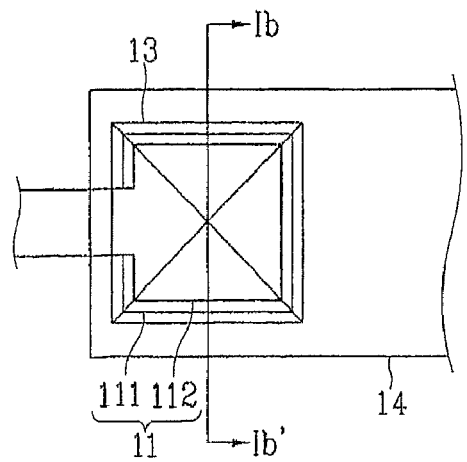
Figure 2D:
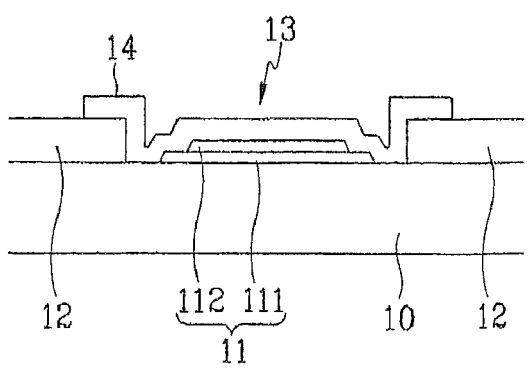

As shown in FIGS. 2C and 2D, the top surface of the under-layer 111 may be exposed to the outside of the over-layer 112 such that the sidewall of the wiring line assembly bears a stepped structure. This is to secure sufficient contact area between the under-layer 111 and the second conductive layer 14. In order to pattern the over-layer 112 and the under-layer 111 differentiated in shape using one photoresist pattern, a slit pattern or a semitransparent film may be used. Alternatively, a photoresist pattern with a relatively thin peripheral portion may be formed through the reflowing process, and etched in a double manner. This will be explained in relation to the process of fabricating a thin film transistor array substrate using four masks.

Meanwhile, as shown in FIGS. 3A to 3D, the wiring line assembly 11 and the contact hole 13 may be transformed in various manner such that they bear a margin for misalignment.

Figure 3A:
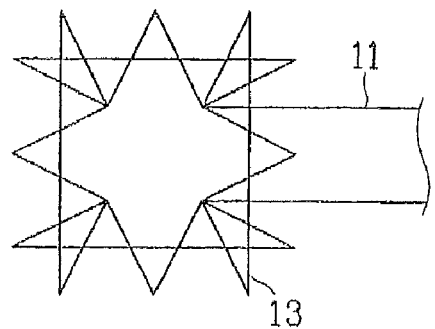
Figure 3B:
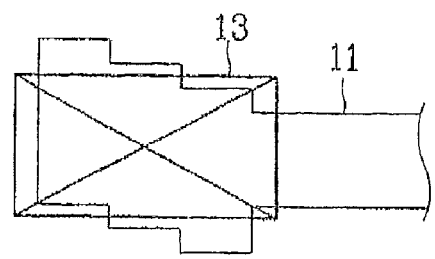
Figure 3C:
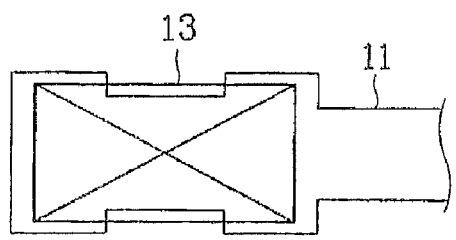
Figure 3D:
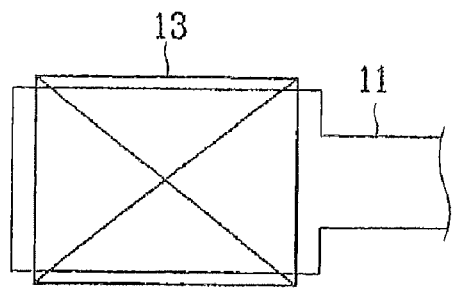
Figure 3E:
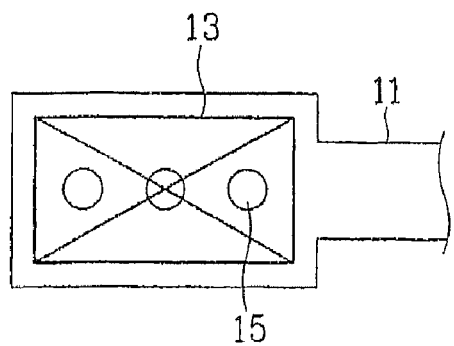

As shown in FIG. 3E, plural numbers of opening portions 15 may be formed at the wiring line assembly 11

The above wiring line contact structure may be applied for use in fabricating a thin film transistor array substrate for a liquid crystal display.

Figure 4:
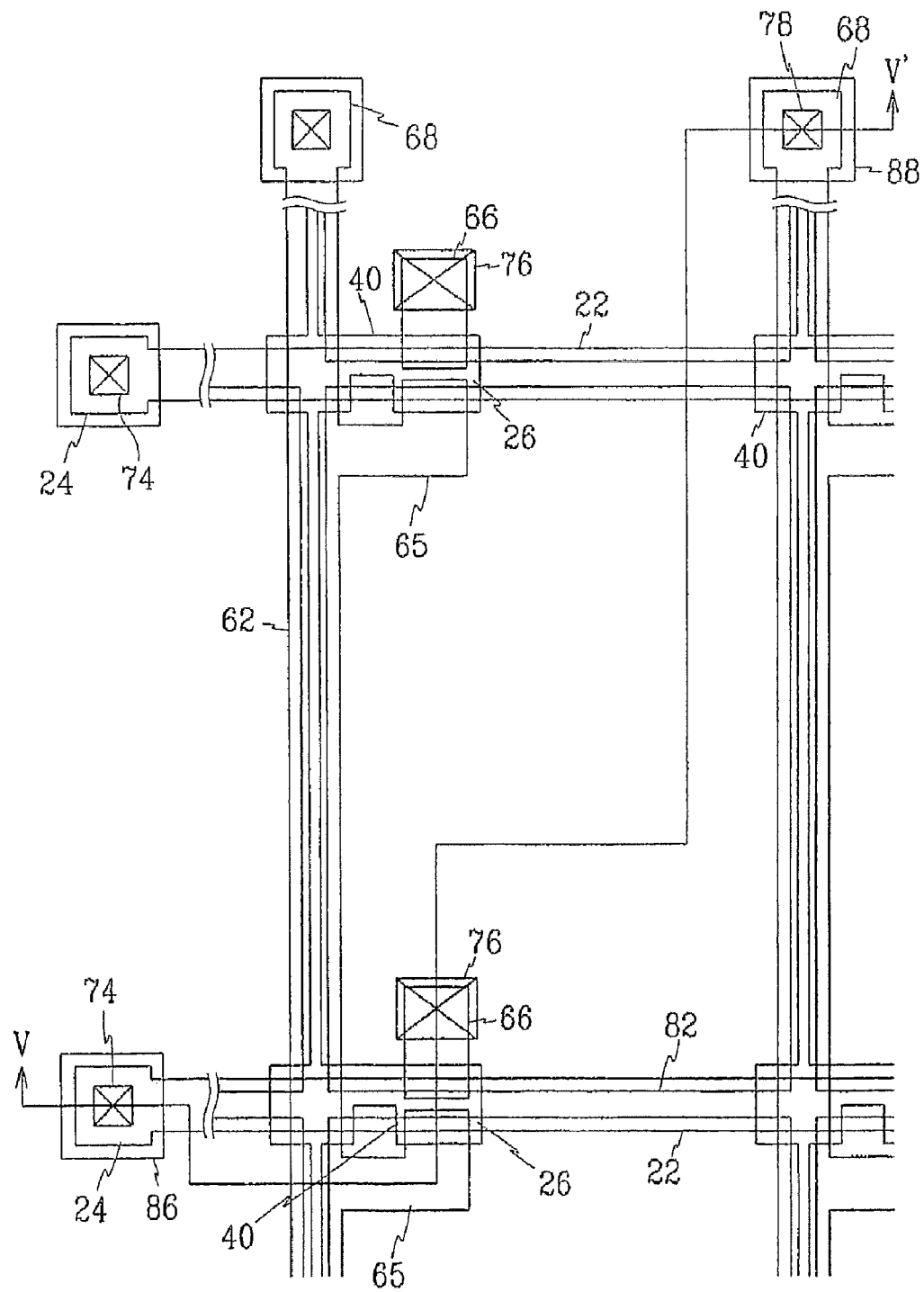
FIG. 4 is a plan view of a thin film transistor array substrate for a liquid crystal display according to a first preferred embodiment of the present invention.
Figure 5:
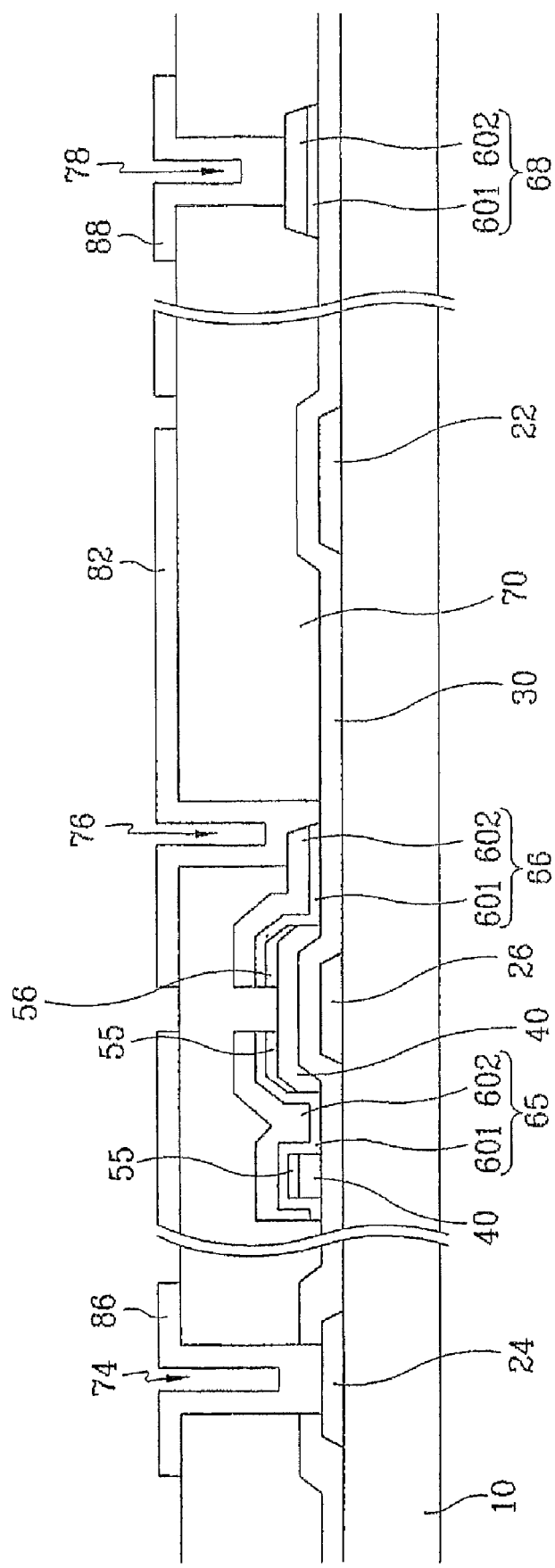
FIG. 5 is a cross sectional view of the thin film transistor array substrate taken along the V-V' line of FIG. 4.

FIG. 4 is a plan view of a thin film transistor array substrate for a liquid crystal display according to a first preferred embodiment of the present invention, and FIG. 5 is a cross sectional view of the thin film transistor array substrate taken along the V-V' line of FIG. 4.

A gate line assembly is formed on an insulating substrate 10 with a low resistance metallic material such as aluminum and aluminum alloy. The gate line assembly includes gate lines 22 proceeding in the horizontal direction, gate pads 24 connected to the gate lines 21 to receive gate signals from the outside and transmit them to the gate lines 22, and gate electrodes 26 connected to the gate lines 22 to form thin film transistors together with other electrode components.

A gate insulating layer 30 is formed on the substrate 10 with silicon nitride SiNx while covering the gate line assembly.

A semiconductor layer 40 is formed on the gate insulating layer 30 with amorphous silicon while being placed over the gate electrodes 26 in the shape of an island. Ohmic contact layers 55 and 56 are formed on the semiconductor layer 40 with $n^+$ hydrogenated amorphous silicon where silicide or n-type impurities are doped at high concentration.

A data line assembly is formed on the ohmic contact layers 55 and 56 as well as on the gate insulating layer 30 with a metallic or conductive material such as aluminum Al, aluminum alloy, molybdenum Mo, molybdenum-tungsten alloy MoW, chrome Cr, tantalum Ta, and titanium Ti. The data line assembly includes data lines 62 proceeding in the vertical direction while crossing over the gate lines 22 to define pixel regions, source electrodes 65 branched from the data lines 62 while being extended over the one-sided ohmic contact layer 54, data pads 68 connected to the one-sided ends of the data lines 62 to receive picture signals from the outside, and drain electrodes 66 separated from the source electrodes 64 around the gate electrodes 26 while being placed on the other-sided ohmic contact layer 56.

The data line assembly may be formed with an aluminum or aluminum alloy-based single-layered structure, or a multiple-layered structure. In case the data line assembly is formed with a double-layered structure, it is preferable that one layer is formed with a low resistance material, and the other layer is formed with a material bearing good contact characteristic with other materials, particularly with respect to IZO. For instance, Al (or Al alloy)/Cr or Al (or Al alloy)/Mo (or Mo alloy) may be used for that purpose. In this preferred embodiment, the data line assembly is formed with a Cr-based under-layer 601 and an aluminum/neodymium (Al/Nd)-based over-layer 602.

A protective layer 70 is formed on the data line assembly and the gate insulating layer 30 with silicon nitride. Contact holes 76 and 78 are formed at the protective layer 70 while exposing the drain electrodes 66 and the data pads 68, respectively. Furthermore, contact holes 74 are formed at the protective layer 70 while exposing the gate pads 24 together with the gate insulating layer 30. The boundary of the drain electrode 66 is exposed through the contact hole 76 such that the sidewalls of the under-layer 601 and the over-layer 602 are exposed to the outside. The contact hole 76 and the drain electrode 66 may be varied in shape as shown in FIGS. 3A to 3E. The area of the contact hole 76 exposing the drain electrode 66 is preferably established to be 4×4 μm-10×10 μm. Furthermore, the boundaries of the pads 24 and 68 may be exposed through the contact holes 74 and 78. In order to minimize contact resistance at the contact area, the contact holes 74 and 78 are preferably formed to be larger than the contact hole 76.

Pixel electrodes 82 are formed on the protective layer 70 at the respective pixel regions while being electrically connected to the drain electrodes 66 through the contact holes 76. The pixel electrodes 82 contact the sidewalls of the drain electrodes 66 exposed through the contact holes 76, particularly the sidewall of the under-layer 601. In this structure, the contact resistance at the contact area can be minimized.

Subsidiary gate and data pads 86 and 88 are formed on the protective layer 70 while being connected to the gate and the data pads 24 and 68 through the contact holes 74 and 78. The pixel electrodes 82, the subsidiary gate pads 86 and the subsidiary data pads 88 are formed with indium zinc oxide (IZO).

As shown in FIGS. 1 and 2, the pixel electrodes 82 are overlapped with the gate lines 22 to thereby form storage capacitors. In case the desired storage capacity is not obtained with the overlapping, a storage capacitor line assembly may be formed at the same plane as the gate line assembly.

A method of fabricating the thin film transistor array substrate will be now explained with reference to FIGS. 6A to 9B as well as FIGS. 4 and 5.

Figure 6A:
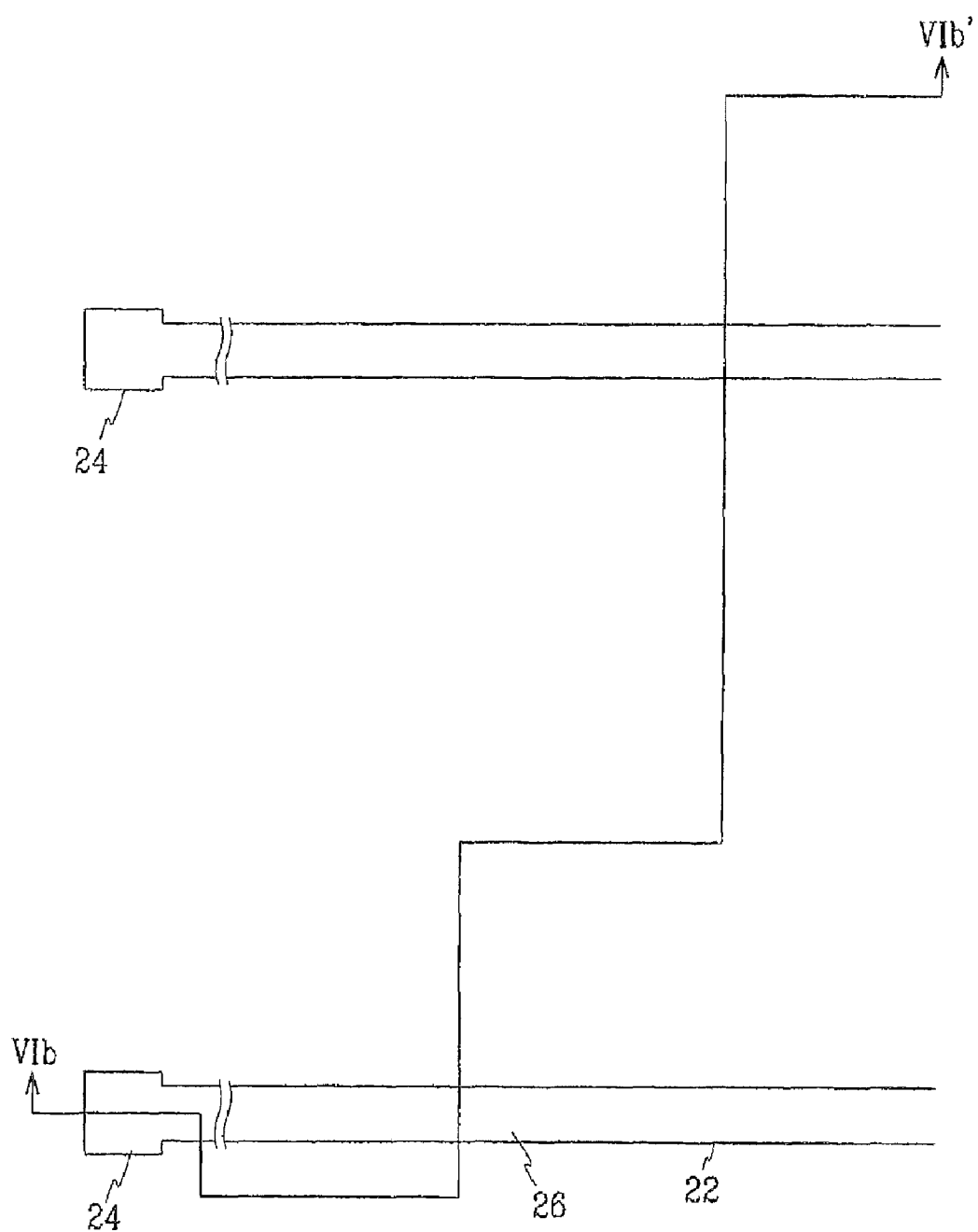
FIGS. 6A, 7A, 8A and 9A sequentially illustrate the steps of fabricating the thin film transistor array substrate shown in FIG. 4.

As shown in FIGS. 6A and 6B, a conductive layer based on a low resistance target material such as aluminum/neodymium (Al/Nd) alloy containing the Nd content of 2 at % is deposited onto a substrate 10 through sputtering at 150° C. such that it has a thickness of 2500 and patterned to thereby form a gate line assembly with a tapering structure. The gate line assembly has gate lines 22, gate electrodes 26, and gate pads 24.

Figure 7A:
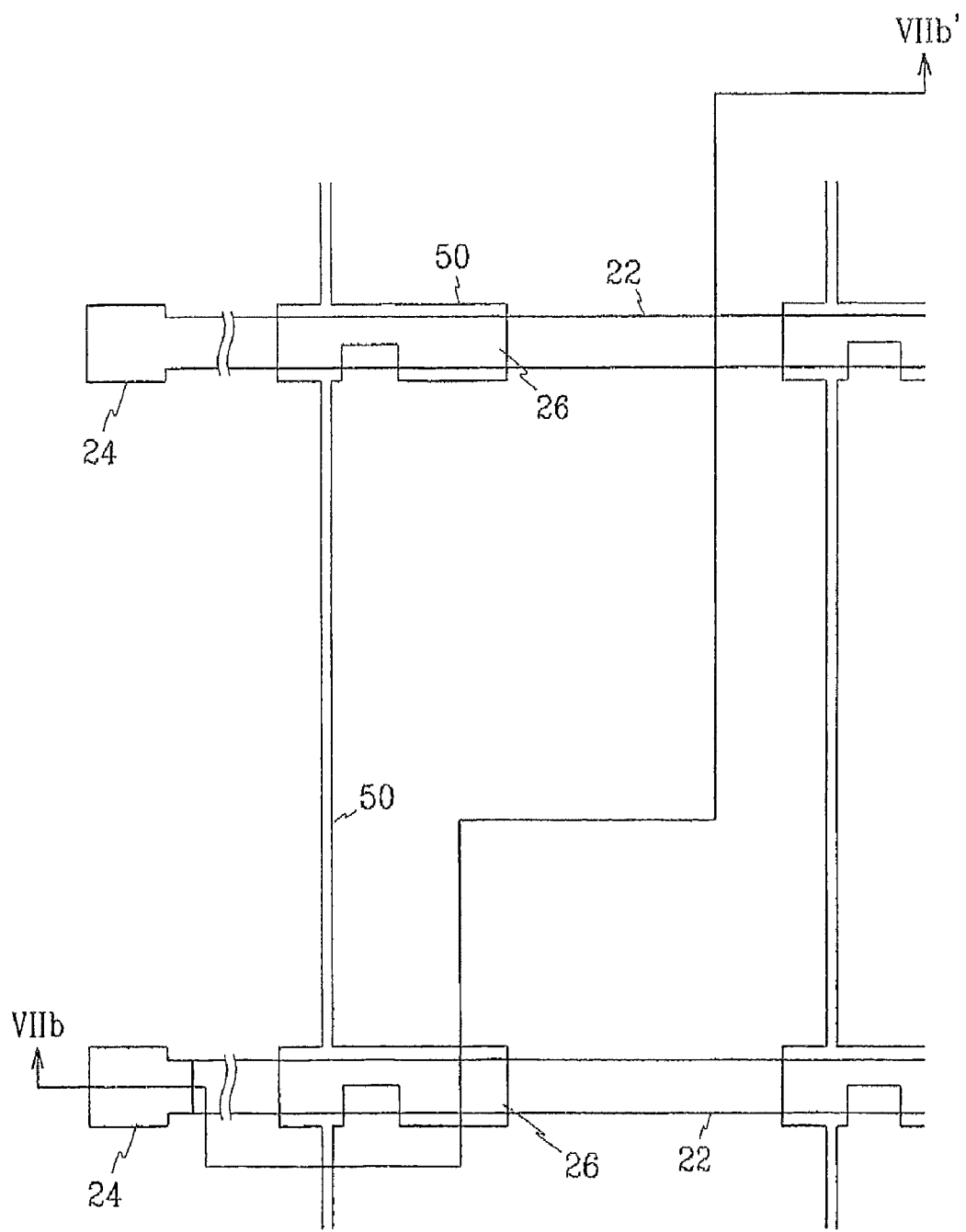

Thereafter, as shown in FIGS. 7A and 7B, a silicon nitride-based gate insulating layer 30, an amorphous silicon layer 40 and a doped amorphous silicon layer 50 are sequentially deposited onto the substrate 10, and the amorphous silicon layer 40 and the doped amorphous silicon layer 50 are patterned through photolithography to thereby form a semiconductor layer 40, and an ohmic contact layer 50 on the gate insulating layer 30 over the gate is electrodes 24. The gate insulating layer 30 is preferably formed through depositing a silicon nitride layer at 250-400° C. such that it bears a thickness of 2000-5000'.

Figure 8A:
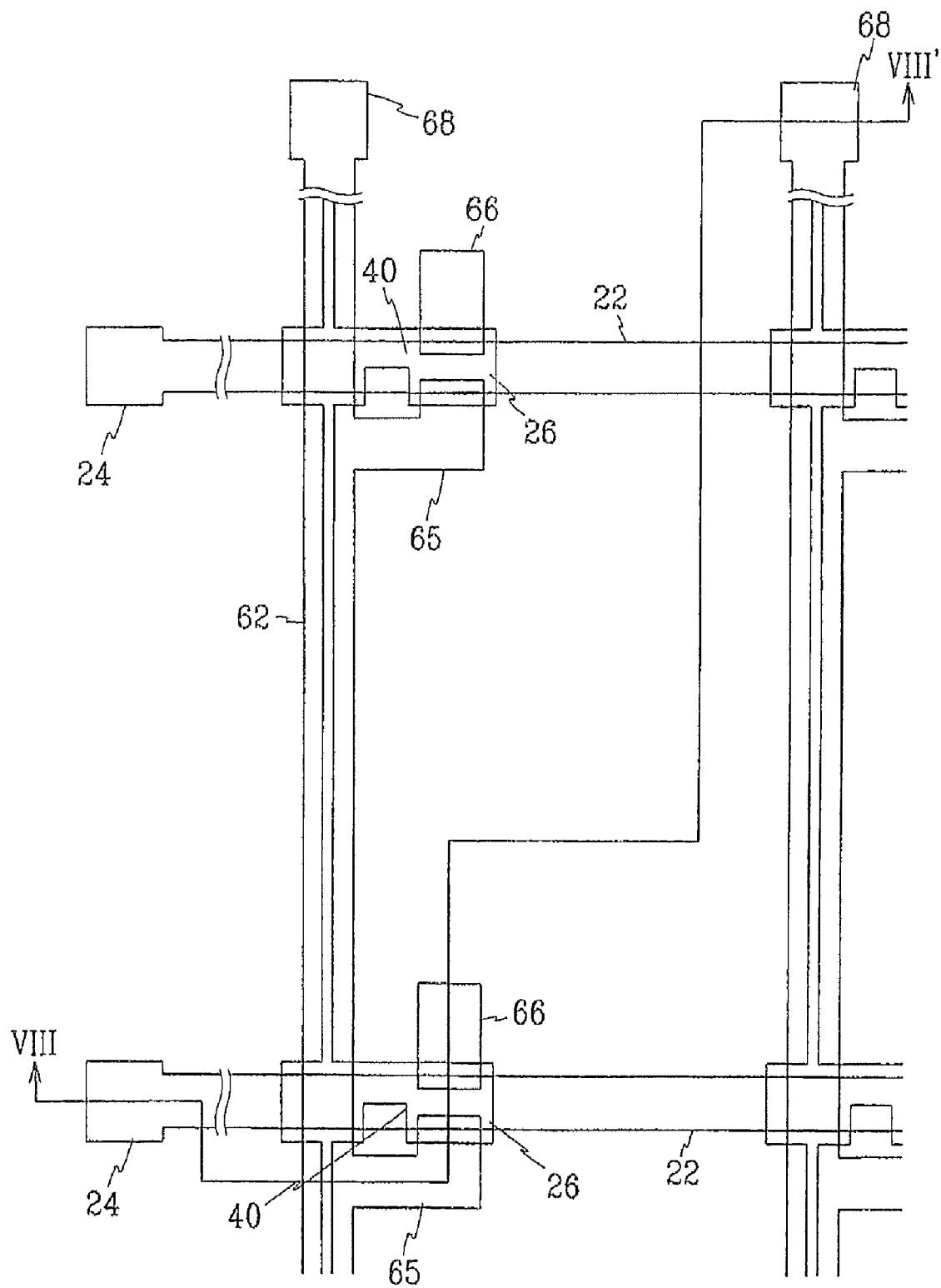
Figure 8B:
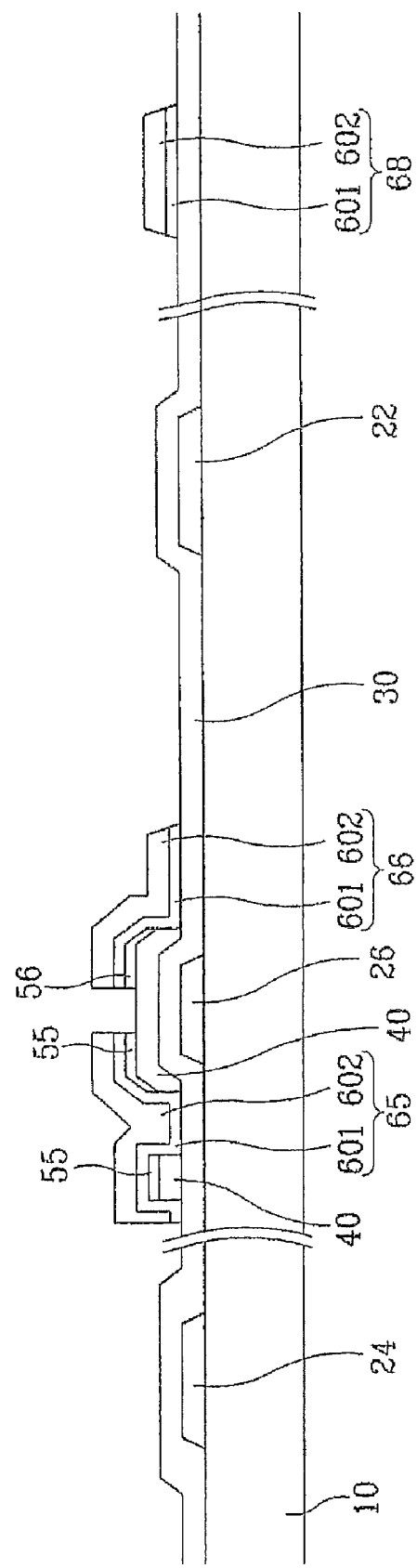
FIG. 8B is a cross sectional view of the thin film transistor array substrate taken along the VIIIb-VIIIb' line of FIG. 8A illustrating the processing step following that illustrated in FIG. 7B.

As shown in FIGS. 8A and 8B, an under-layer 601 with a thickness of 500.ANG. based on molybdenum, molybdenum alloy or chrome, and an over-layer 602 with a thickness of 2500' based on a low resistance target material such as Al—Nd alloy containing the Nd content of 2 at % are sequentially deposited onto the substrate 10 through sputtering at 150° C., and patterned through photolithography to thereby form a data line assembly with a tapering structure. The data line assembly includes data lines 62 crossing over the gate lines 22, source electrodes 65 connected to the data lines 62 while being extended over the gate electrodes 26, data pads 68 connected to the one-sided ends of the data lines 62, and drain electrodes 66 facing the source electrodes 65 around the gate electrodes 26 while being separated from the source electrodes 65.

The over-layer 602 and the under-layer 601 may be all etched through wet etching. It is also possible that the over-layer 602 is etched through wet etching whereas the under-layer 601 is etched through dry etching. In case the under-layer 601 is formed with molybdenum or molybdenum alloy, it may be patterned together with the over-layer 602 under the same etching condition.

An opening portion may be made only at the over-layer 602 of the drain electrode 66 while forming a contact structure as shown in FIGS. 2A and 2B. The area of the opening portion is preferably established to be 4×4 μm or less such that a separate photolithography process is not needed.

In order that the under-layer 601 can well contact an IZO-based layer to be formed later, it is preferable to prevent the under-layer 601 from being undercut to the bottom of the over-layer 602, or to extend the under-layer 601 to the outside of the over-layer 602. In case the under-layer 601 is formed with molybdenum or molybdenum alloy, the thickness ratio of the under-layer 601 to the over-layer 602 is established to be 1/5 or more, and the deposition thereof is made by way of a DIP mode, thereby preventing the under-layer 601 from being undercut. Furthermore, in case the under-layer 601 is formed with chrome, the aluminum or aluminum alloy-based over-layer 602 is partially removed during the step of cleaning or removing the photoresist film such that the chrome-based under-layer 601 is exposed to the outside.

Thereafter, the doped amorphous silicon layer 50 exposed through the data line assembly is etched such that it is separated into two portions around the gate electrode 26 while exposing the semiconductor layer 40 between them. In order to stabilize the exposed surface of the semiconductor layer 40, oxygen plasma is preferably made thereto.

Figure 9A:
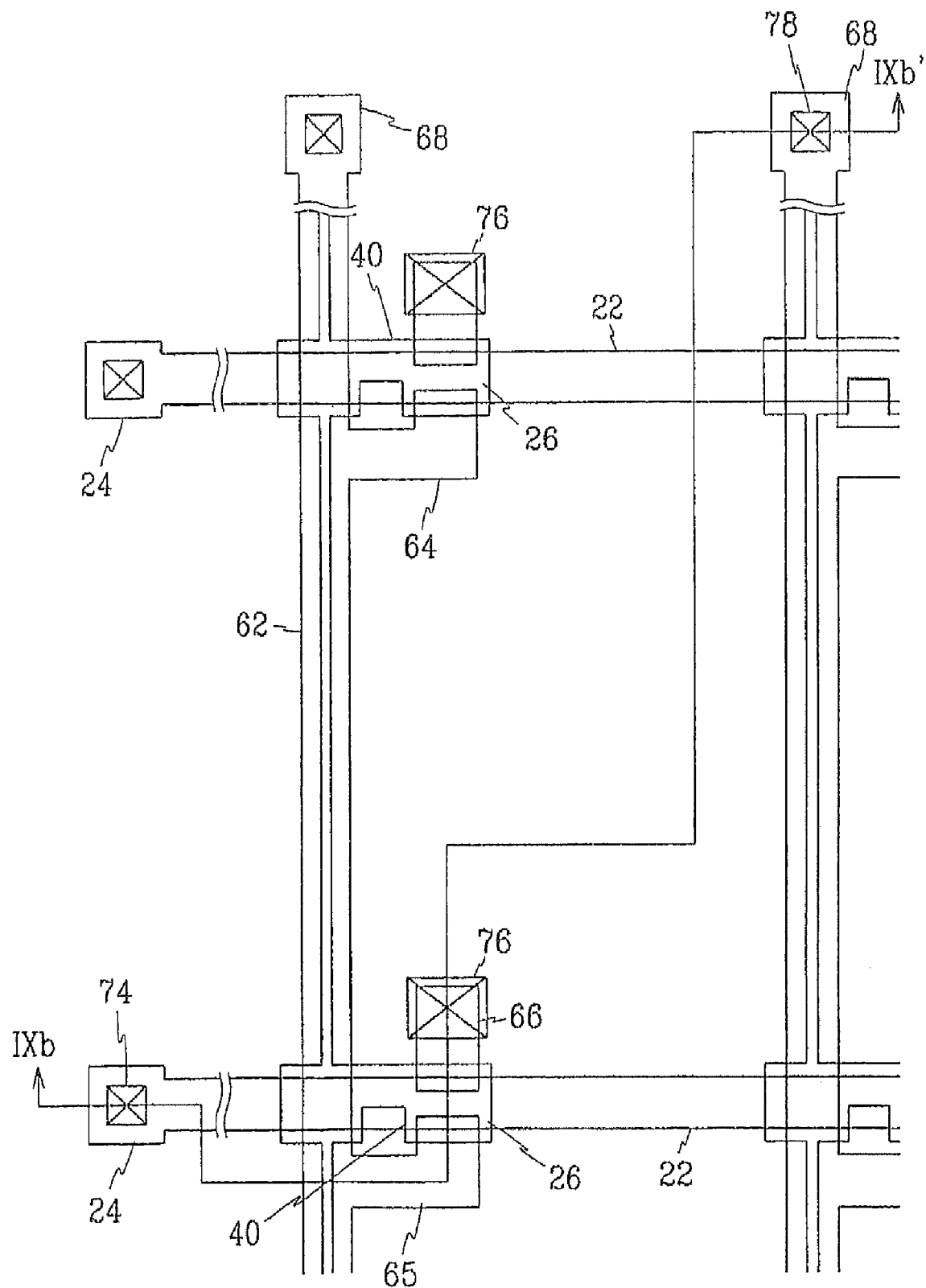

As shown in FIGS. 9A and 9B, an inorganic insulating layer based on silicon nitride is deposited onto the substrate 10 at 250-400° C. to thereby form a protective layer 70. The protective layer 70 is patterned through photolithography together with the gate insulating layer 30 to thereby form contact holes 74, 76 and 78 exposing the gate pads 24, the drain electrodes 66 and the data pads 68, respectively. The etching condition is preferably established such that the aluminum or aluminum alloy-based metallic layer is not etched. An F-based gas may be used as the etching gas. The boundary of the drain electrode 66 is exposed through the contact hole 76 such that the sidewalls of the over-layer 602 and the under-layer 601 are exposed to the outside. It is preferable that the boundary of the contact hole 76 and the boundary of the drain electrode 66 are spaced apart from each other with a distance of 2 μm or less. This is to minimize the contact resistance between the pixel electrodes 82 and the drain electrodes 66 while preventing the drain electrodes 66 from being undercut due to the formation of the contact holes 76. That is, when the distance between the boundary of the contact hole 76 and the boundary of the drain electrode 66 is established to be 3 μm or more, the gate insulating layer 30 is extremely etched to the bottom of the drain electrode 66 while making undercut at the contact hole 76. Consequently, the pixel electrode 82 to be formed later may be cut at the bottom of the drain electrode 66 due to the stepped difference of the gate insulating layer 30 while increasing the contact resistance at the contact area. However, in this preferred embodiment, as the distance between the boundary of the contact hole 76 and the boundary of the drain electrode 66 is established to be 2 μm or less, the gate insulating layer 30 is not overly etched to the bottom of the drain electrode 66 while completely exposing the sidewall of the drain electrode 66. Of course, it is also possible that the boundaries of the pads 24 and 68 may be exposed to the outside through the contact holes 74 as shown in FIGS. 1A and 1B.

Finally, as shown in FIGS. 4 and 5, an IZO-based layer is deposited onto the substrate 10 through sputtering, and patterned through photolithography to thereby form pixel electrodes 82 connected to the drain electrodes 66 through the contact holes 76, and subsidiary gate and data pads 86 and 88 connected to the gate and the data pads 24 and 68 through the contact holes 74 and 78, respectively. The pixel electrodes 82 are prevented from being cut while contacting the under-layer 601 in a reliable manner, thereby minimizing the contact resistance at the contact area. Indium x-metal oxide (IDIXO) by the Idemitsu Company is used as the target material for forming the IZO-based layer 82, 86 and 88. The target material contains $In_2O_3$ and ZnO. It is preferable that the Zn content is established to be 15-20 at %. In order to minimize the contact resistance, the deposition of the IZO-based layer is made at 250° C. or less.

A contact structure was formed at the periphery of the substrate external to the display area thereof as a test pattern such that it bore the same structure as that formed at the display area, and the contact resistance was measured in three possible cases. In the first case, the contact hole 76 was formed over the drain electrode 66. In the second case, the boundary of the contact hole 76 was spaced apart from the boundary of the drain electrode 66 by the distance of 3 μm or more. In the third case, the boundary of the contact hole 76 was spaced apart from the boundary of the drain electrode 66 by the distance of 2 μm or less. Two hundred test patterns were made in relation to the first to the third cases, and contact resistance thereof was measured. As a result, the contact resistance related to the first and the second cases turned out to be E7Ω or more, but that related to the third case to be E6Ω or less.

Meanwhile, the contact resistance at the contact area was measured by way of test patterns in relation to various processing conditions.

FIG. 10 is a table illustrating the contact resistance of the test patterns formed at the periphery of the thin film transistor array substrate.

The test patterns were formed at the periphery of the substrate external to the display area thereof. As shown in FIGS. 1A and 1B, the contact structure was simplified with a wiring line assembly bearing a chrome-based under-layer and an aluminum alloy-based over-layer, a silicon nitride-based insulating layer with a contact hole, and an IZO-based layer. Two hundred contact structures were made, and the contact resistance thereof was measured. In the first pattern, the boundary of the contact hole was placed over the wiring line assembly. In the second pattern, the sidewall of the wiring line assembly contacted the IZO-based layer. The contact resistance of the insulating layer was measured in condition that the protective layer and the gate insulating layer were deposited at 235° C. and 310° C. by the thickness of 2000' and 3000', respectively. The contact resistance of the wiring line assembly was measured in condition that the aluminum alloy-based layer was deposited at 150° C. and 50° C., respectively. Furthermore, the contact resistance of the wiring line assembly was measured in several different cases. In the first case, the wiring line assembly was exposed to the gas for etching the ohmic contact layers of 1500' and 3000'. In the second case, the insulating layer was etched by way of a PE mode for 63 seconds and 68 seconds to thereby form contact holes. In the third case, the insulating layer was etched by way of an IP mode at 1000 W and 400 W to thereby form contact holes. In the fourth case, the wiring line assembly exposed through the contact holes was cleaned for 70 seconds, or not.

As shown in FIG. 10, when the contact hole is formed by 10×10 μm, the contact resistance of the first pattern turned out to be 5.3 MΩ-4.0 GΩ, and that of the second pattern to be 14 KΩ-515 KΩ. There existed a case where the contact resistance of the first pattern was measured to be 60 KΩ. In this case, the contact structure of the first pattern was formed like that of the second pattern such that the boundary of the wiring line assembly was exposed through the contact hole, and the IZO-based layer sufficiently contacted the sidewall of the wiring line assembly, particularly the under-layer thereof.

Furthermore, in case the contact hole was formed by 7×7 μm, the contact resistance of the first pattern turned out to be 12 MΩ-7.9 GΩ, and that of the second pattern to be 18 KΩ-664 KΩ. In case the contact hole was formed by 4×4 μm, the contact resistance of the first pattern turned out to be 48 MΩ-85 GΩ, and that of the second pattern to be 30 KΩ-1.2 MΩ.

In the above-structured thin film transistor array substrate, the gate line assembly and the data line assembly contain a low resistance conductive layer based on aluminum or aluminum alloy, and the contact resistance between the data line assembly and the IZO-based pixel electrodes 82 at the contact area is minimized. Consequently, such a substrate can be well adapted for use in fabricating a wide-screened high definition liquid crystal display.

Alternatively, the above process may be made using only four masks.

Figure 11:
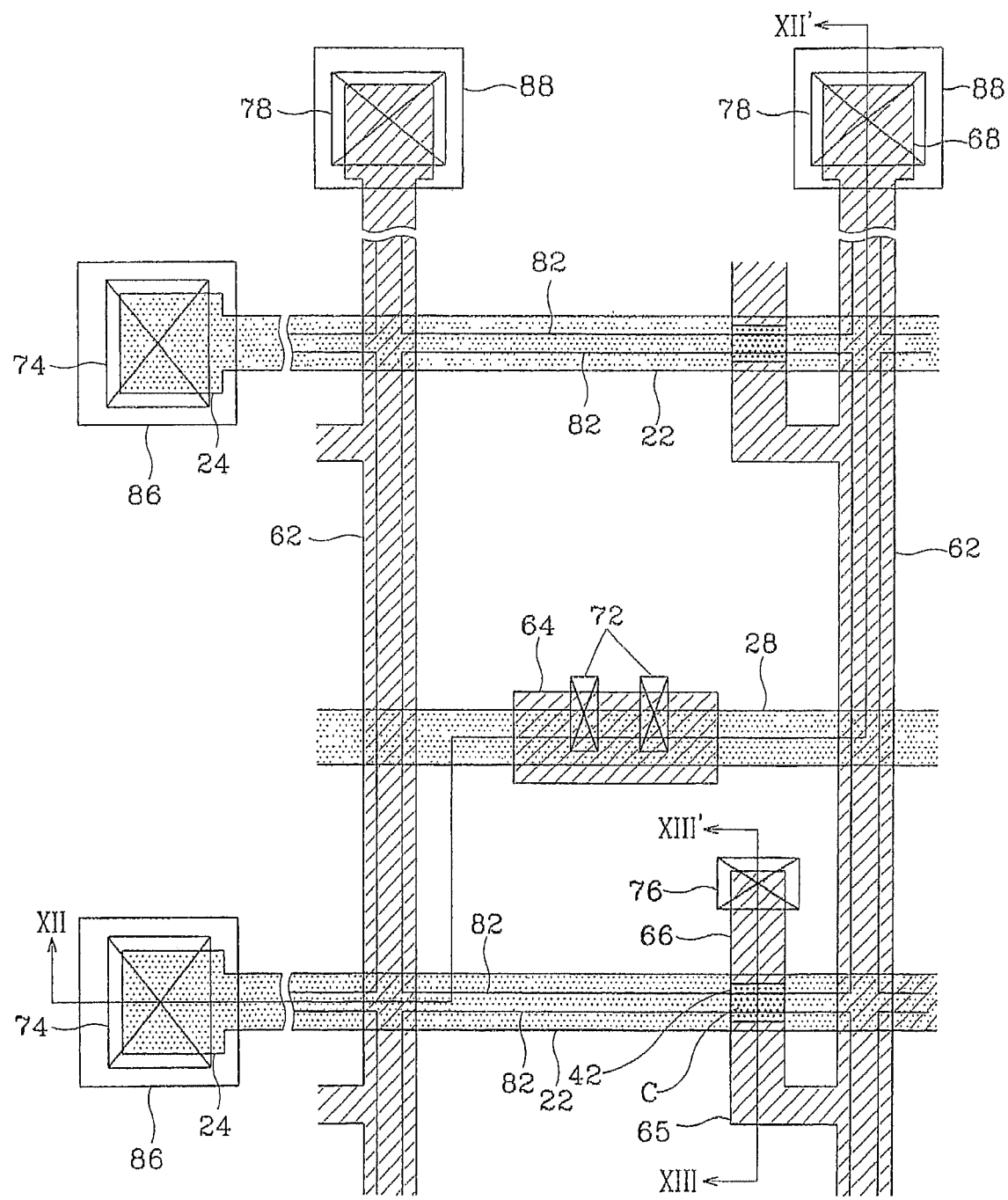
FIG. 11 is a plan view of a thin film transistor array substrate for a liquid crystal display according to a second preferred embodiment of the present invention.
Figure 12:
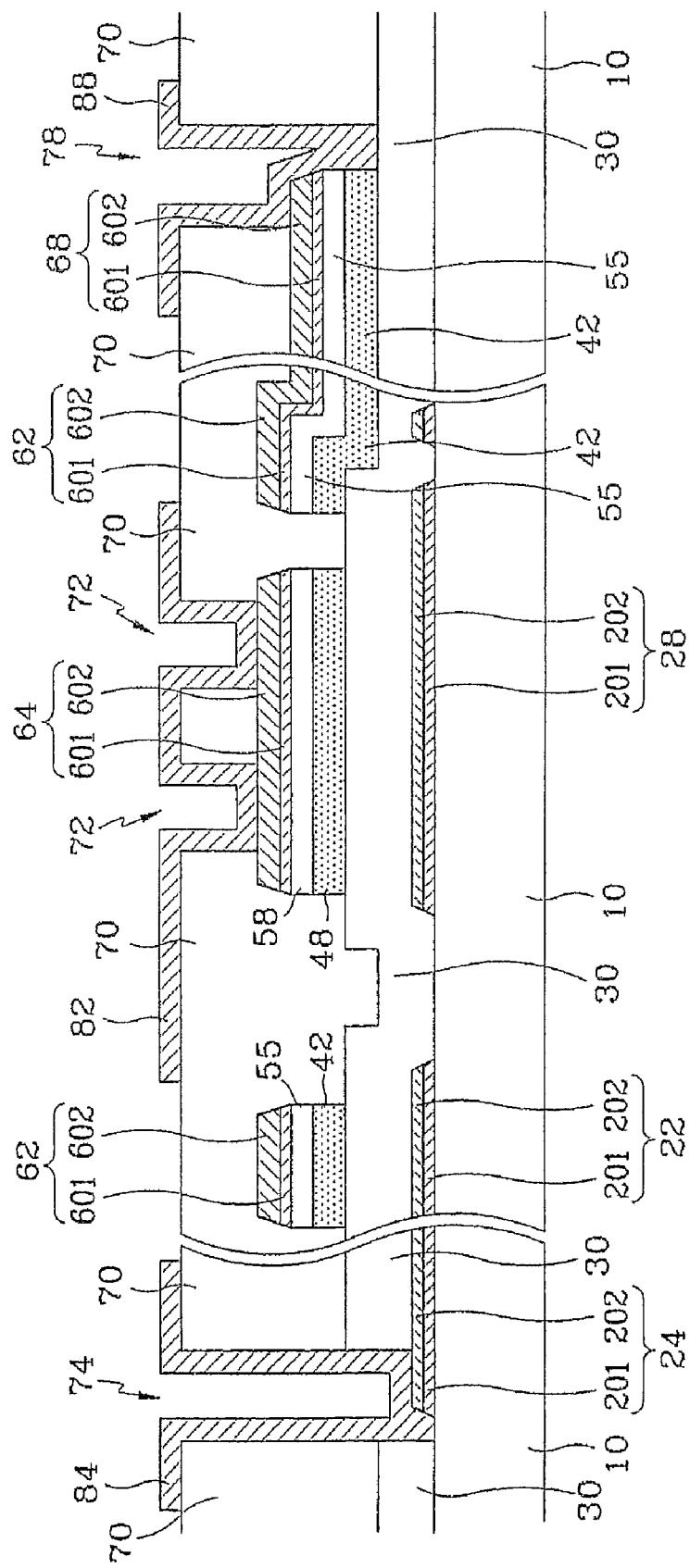
FIGS. 12 and 13 are cross sectional views of the thin film transistor array substrate taken along the XII-XII' line and the XIII-XIII' line of FIG. 11.
Figure 13:
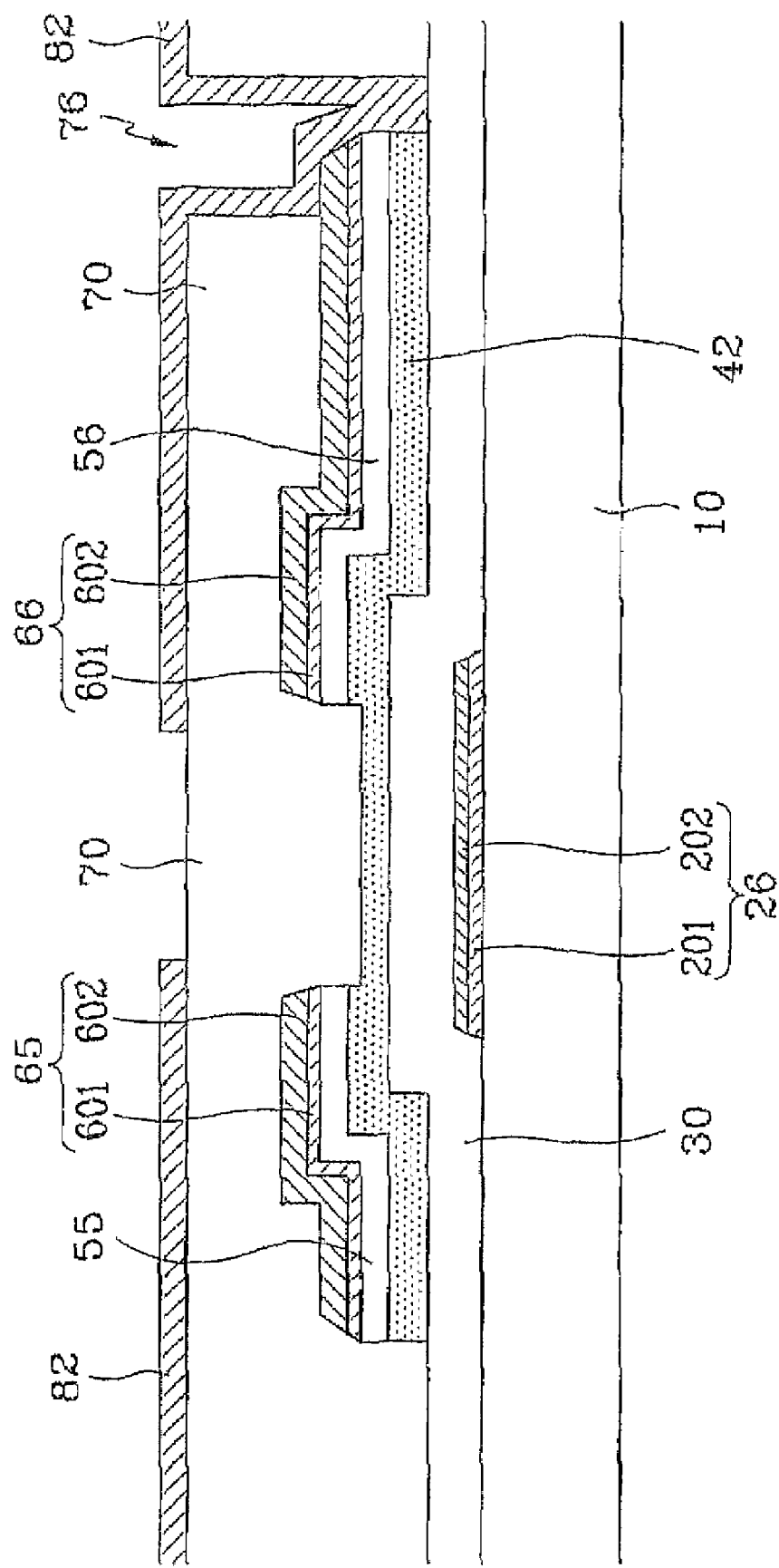

FIG. 11 is a plan view of a thin film transistor array substrate for a liquid crystal display according to a second preferred embodiment of the present invention, and FIGS. 12 and 13 are cross sectional views of the thin film transistor array substrate taken along the XII-XII' line and the XIII-XIII' line of FIG. 11.

A gate line assembly is formed on an insulating substrate 10 with a low resistance conductive material such as aluminum and aluminum alloy. The gate line assembly includes gate lines 22, gate pads 24, and gate electrodes 26. The gate line assembly further includes storage capacitor electrodes 28 proceeding parallel to the gate lines 22 to receive common electrode voltages from the outside. The storage capacitor electrodes 28 are overlapped with storage capacitor conductive patterns 68 connected to pixel electrodes 82 to thereby form storage capacitors for enhancing the electric potential storage capacity of the pixels. In case the desired storage capacity is obtained with the overlapping of the pixel electrodes 82 and the gate lines 22, the storage capacitor electrodes 28 may be omitted.

The gate line assembly may bear a double-layered structure. In this case, the gate line assembly has an under-layer 201 based on chrome, molybdenum, molybdenum alloy, tantalum or titanium, which exhibits a low contact resistance with respect to IZO, and an over-layer 202 based on aluminum or aluminum alloy.

A gate insulating layer 30 is formed on the gate line assembly with silicon nitride SiNx while covering the gate line assembly.

Semiconductor patterns 42 and 48 are formed on the gate insulating layer 30 with hydrogenated amorphous silicon. Ohmic contact patterns 55, 56 and 58 are formed on the semiconductor patterns 42 and 48 with amorphous silicon where n type impurities such as phosphorous P are doped at high concentration.

A data line assembly is formed on the ohmic contact patterns 55, 56 and 58 with a low resistance conductive material such as aluminum and aluminum alloy. The data line assembly includes a data line unit with data lines 62 proceeding in the vertical direction, data pads 68 connected to the one-sided ends of the data lines 62 to receive picture signals from the outside, and source electrodes 65 branched from the data lines 62. The data line assembly further includes drain electrodes 66 facing the source electrodes 65 around the gate electrodes 26 or the channel portions C while being separated from the source electrodes 65, and storage capacitor conductive patterns 64 placed over the storage capacitor electrodes 28. In case the storage capacitor electrodes 28 are absent, the storage capacitor conductive patterns 64 are also omitted.

The data line assembly may bear a double-layered structure. In this case, the gate line assembly has an under-layer 601 based on chrome, molybdenum, molybdenum alloy, tantalum or titanium, and an over-layer 602 based on aluminum or aluminum alloy.

The ohmic contact patterns 55, 56 and 58 lower the contact resistance between the semiconductor patterns 42 and 48 and the data line assembly while bearing the same shape as the data line assembly. That is, the data line unit ohmic contact pattern 55 has the same shape as the data line unit 62, 65 and 68, and the drain electrode ohmic contact pattern 56 has the same shape as the drain electrode 66, and the storage capacitor ohmic contact pattern 58 has the same shape as the storage capacitor conductive pattern 64.

Meanwhile, the semiconductor patterns 42 and 48 have the same shape as the data line assembly and the ohmic contact patterns 55, 56 and 58 except for the channel portions C. Specifically, the storage capacitor semiconductor pattern 48, the storage capacitor conductive pattern 64 and the storage capacitor ohmic contact pattern 58 have the same shape, but the thin film transistor semiconductor pattern 42 slightly differs from the data line assembly and the ohmic contact patterns. That is, the source and the drain electrodes 65 and 66 are separated from each other at the channel portion C, and the data line unit ohmic contact pattern 55 and the drain electrode ohmic contact pattern 56 are also separated from each other at the channel portion C. However, the thin film transistor semiconductor pattern 42 continuously proceeds at the channel portion C without separation to thereby form a thin film transistor channel.

A protective layer 70 is formed on the data line assembly with silicon nitride.

The protective layer 70 has contact holes 76, 78 and 72 exposing the drain electrodes 66, the data pads 68, and the storage capacitor conductive patterns 64, respectively. Furthermore, the protective layer 70 has contact holes 74 exposing the gate pads 24 together with the gate insulating layer 30. The contact holes 72, 74, 76 and 78 are formed such that they expose the sidewalls of the storage capacitor conductive patterns 64, the gate pads 24, the drain electrodes 66 and the data pads 68, particularly the under-layers 201 and 601 thereof, which exhibit a low contact resistance with respect to the IZO-based layer.

Pixel electrodes 82 are formed on the protective layer 70 to receive picture signals from the thin film transistors and form electric fields together with a common electrode formed at the counter substrate. The pixel electrodes 82 are formed with a transparent conductive material such as indium zinc oxide (IZO). The pixel electrodes 82 are electrically connected to the drain electrodes 66 through the contact holes 76 to receive the picture signals. Furthermore, the pixel electrodes 82 are overlapped with the neighboring gate lines 22 and data lines 62 to enhance the opening or aperture ratio. The overlapping may be omitted. In addition, the pixel electrodes 82 are connected to the storage capacitor conductive patterns 64 through the contact holes 72 to transmit the picture signals to the conductive patterns 64. Subsidiary gate and data pads 86 and 88 are formed over the gate and the data pads 24 and 68 while being connected thereto through the contact holes 74 and 78 to reinforce the adhesive strength of the pads 24 and 68 to external circuits while protecting the pads. The subsidiary gate and data pads 84 and 88 are not necessary, but may be selectively introduced. The IZO-based layers 82, 86 and 88 contact the sidewalls of the storage capacitor conductive patterns 64, the gate pads 24, the drain electrodes 66 and the data pads 68, particularly the under-layers 201 and 601 thereof exhibiting a lower contact resistance with respect to the IZO-based layer.

It is possible that the pixel electrodes are formed with a transparent conductive polymer. In the case of a reflective type liquid crystal display, the pixel electrodes 82 may be formed with an opaque conductive material.

A method of fabricating the thin film transistor array substrate will be now explained with reference to FIGS. 14A to 21C as well as FIGS. 11 to 13.

Figure 14A:
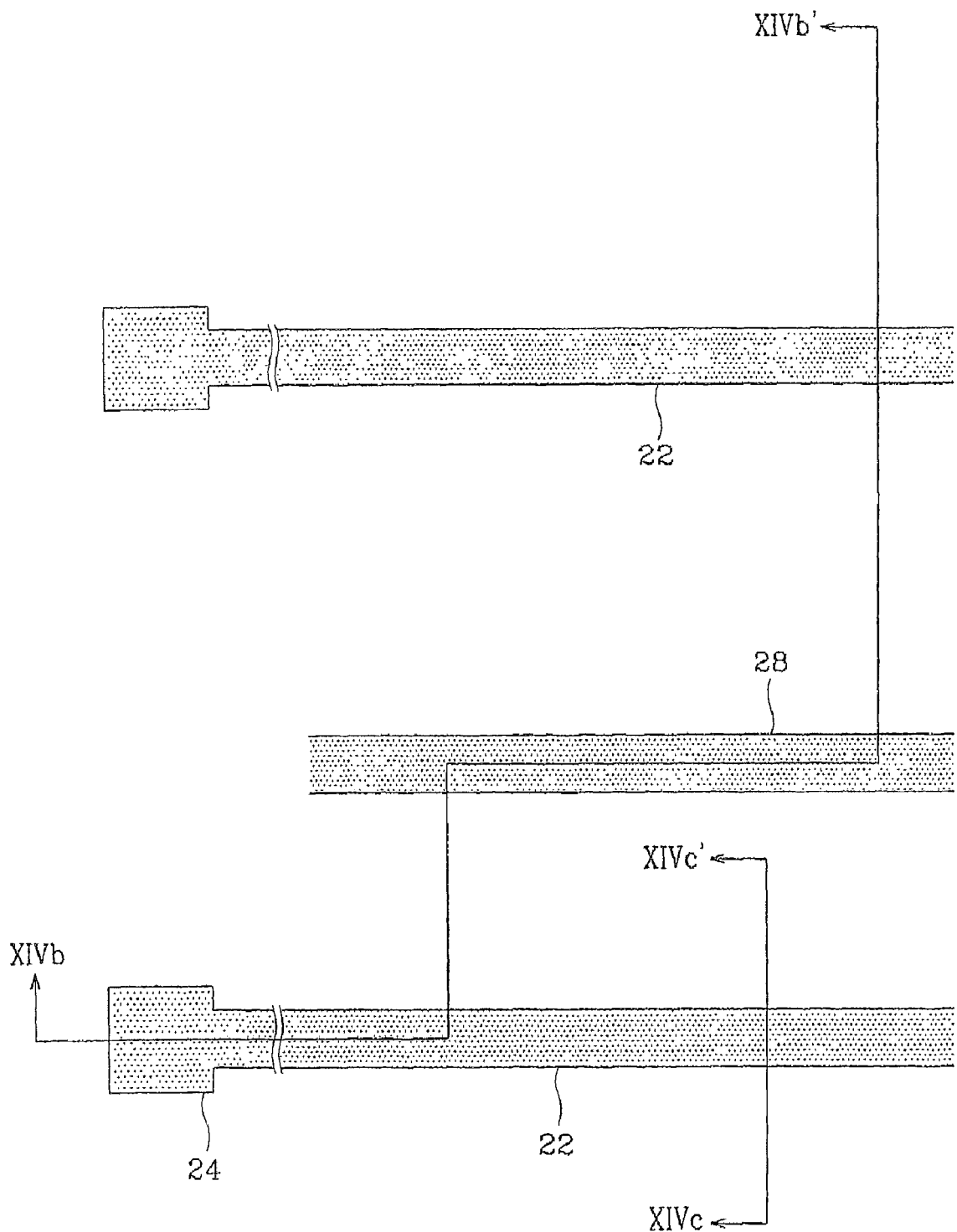
FIG. 14A illustrates the first step of fabricating the thin film transistor array substrate shown in FIG. 11.

As shown in FIGS. 14A to 14C, an under-layer 201 based on molybdenum, molybdenum alloy or chrome, which exhibits a contact resistance with respect to IZO lower than aluminum, and an over-layer 202 based on Al—Nd alloy containing the Nd content of 2 at % are sequentially deposited onto a substrate 10 through sputtering, and patterned through photolithography using a mask to thereby form a gate line assembly bearing a tapering structure. The gate line assembly has gate lines 22, gate pads 24, gate electrodes 26, and storage capacitor electrodes 28. In order that the under-layer 201 can contact an IZO-based layer to be formed later in a sufficient manner, the under-layer 201 is prevented from being undercut to the bottom of the over-layer 202, or extends to the outside of the over-layer 202. For this purpose, in case the under-layer 201 is formed with molybdenum or molybdenum alloy, the thickness ratio of the under-layer 201 to the over-layer 202 is established to be 1/5 or more, and the etching thereof is made by way of a DIP mode where the substrate is dipped in the etching solution such that the under-layer 201 can be prevented from being undercut. Furthermore, in case the under-layer 201 is formed with chrome, the under-layer 201 is deposited by the thickness of 500' or less, and the aluminum or aluminum alloy-based over-layer is partially removed during the cleaning process or the photoresist film removal process. In this way, the chrome-based under-layer 201 extends to the outside of the over-layer 202.

Figure 15A:
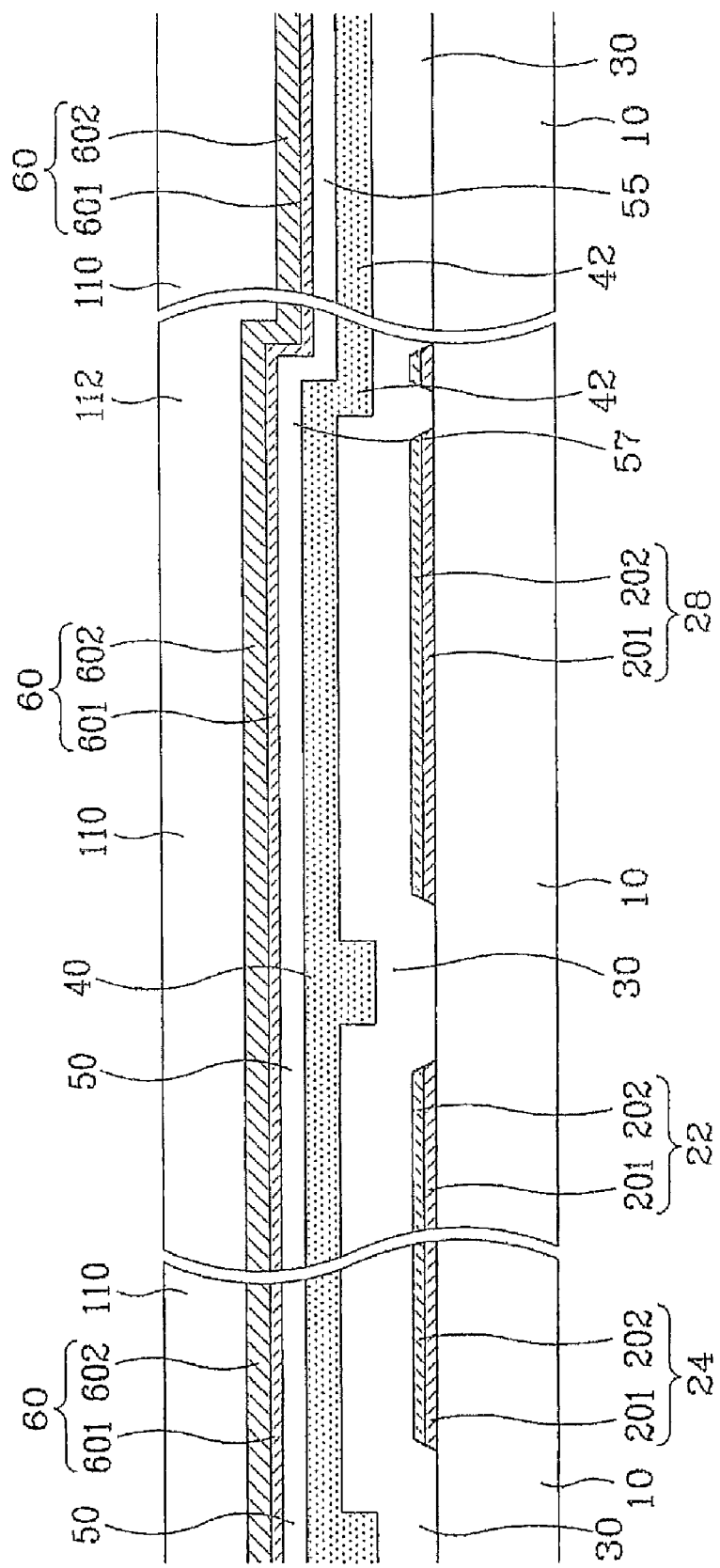
FIGS. 15A and 15B illustrate the step of fabricating the thin film transistor array substrate following that illustrated in FIGS. 14B and 14C.
Figure 15B:
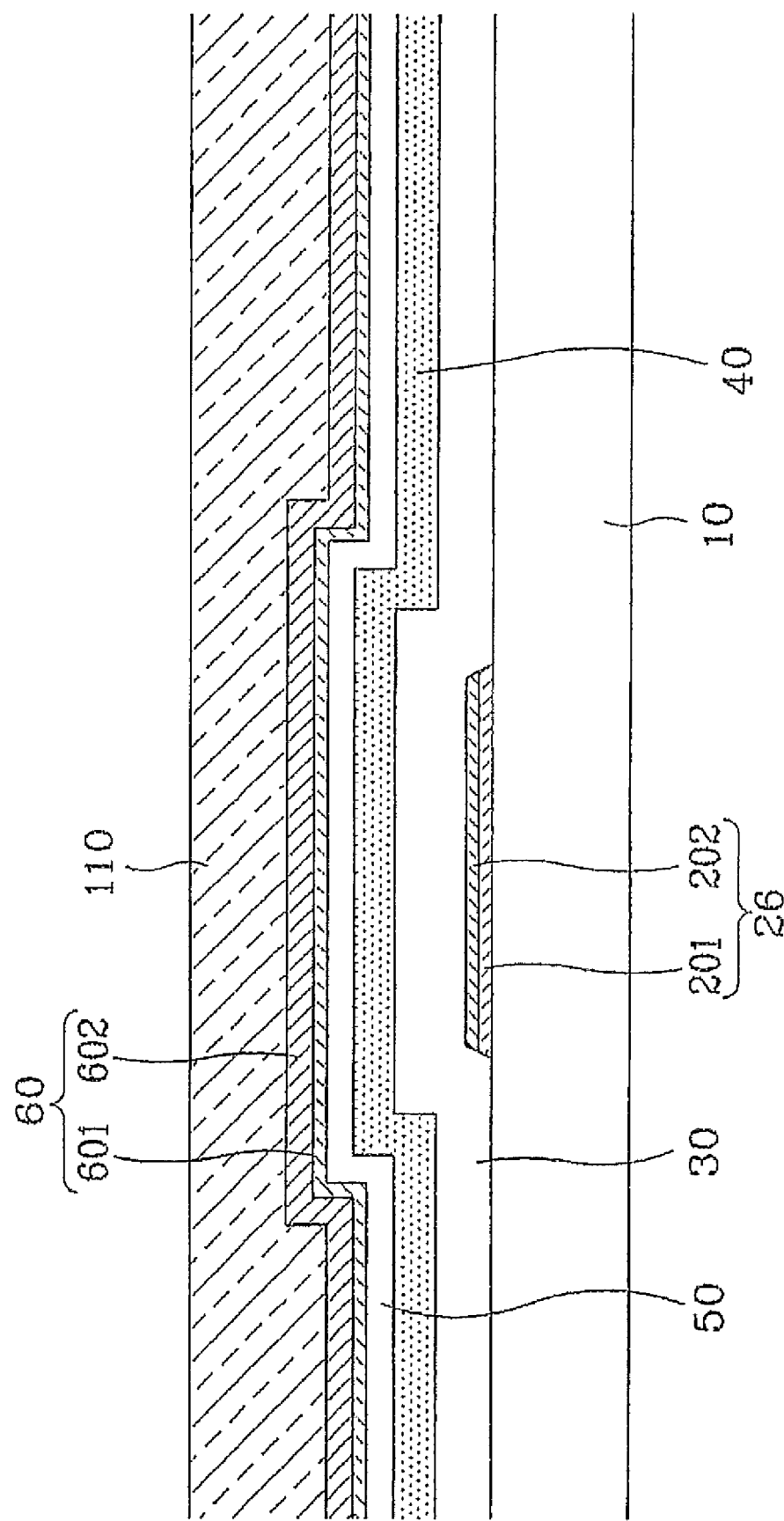

Thereafter, as shown in FIGS. 15A and 15B, a gate insulating layer 30, a semiconductor layer 40 and an ohmic contact layer 50 are sequentially deposited onto the substrate 10 by way of chemical vapor deposition such that they bear a thickness of 1500-5000', 500-2000' and 300-600', respectively. A conductive layer 60 with an under-layer 601 based on aluminum or aluminum alloy and an over-layer 602 based on chrome, molybdenum or molybdenum alloy is deposited onto the substrate 10 by way of sputtering such that it bears a thickness of 1500-3000'. A photoresist film 110 with a thickness of 1-2 µm is then coated onto the conductive layer 60.

Figure 16A:
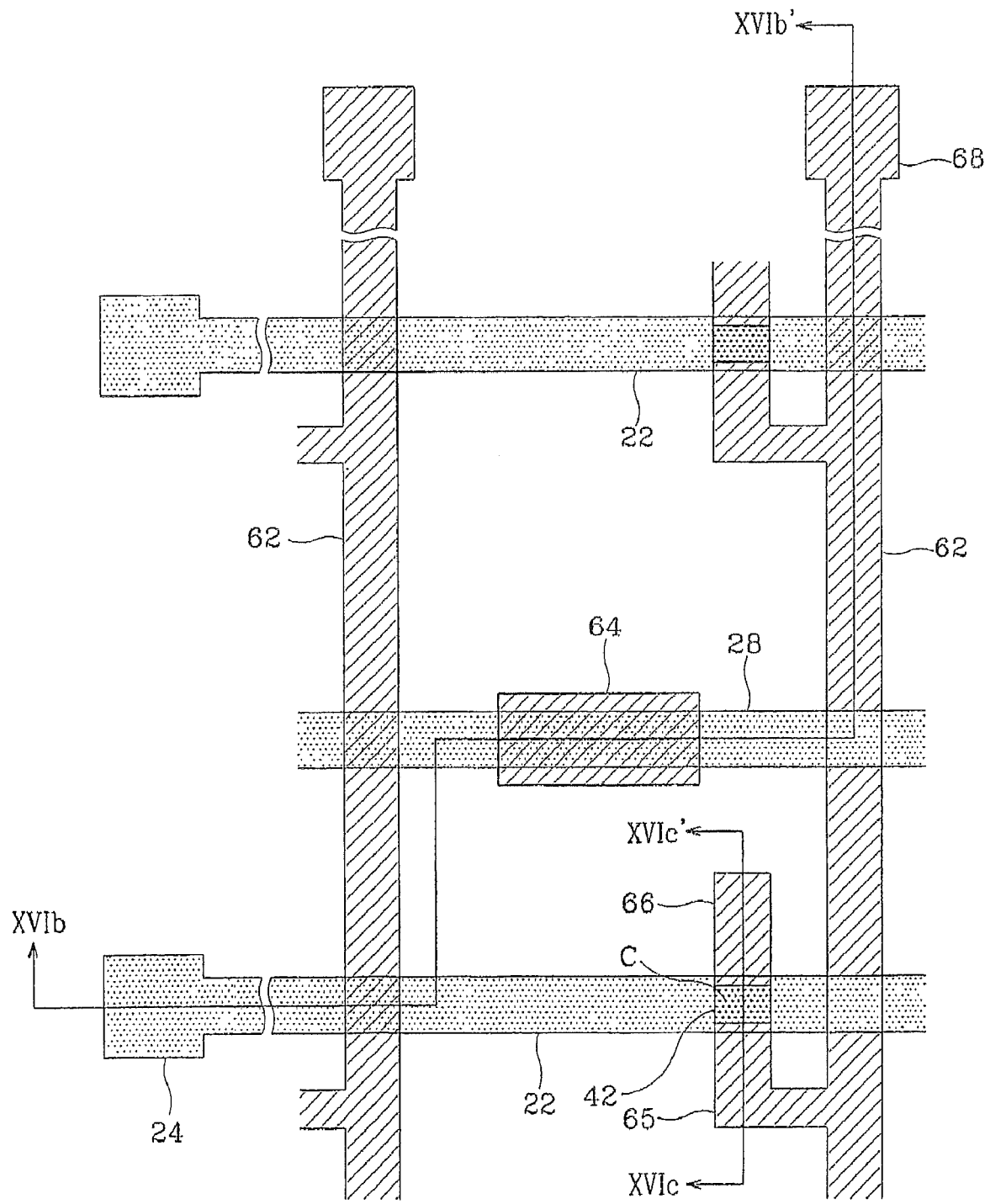
FIG. 16A illustrates the step of fabricating the thin film transistor array substrate following that illustrated in FIGS. 15A and 15B.
Figure 16B:
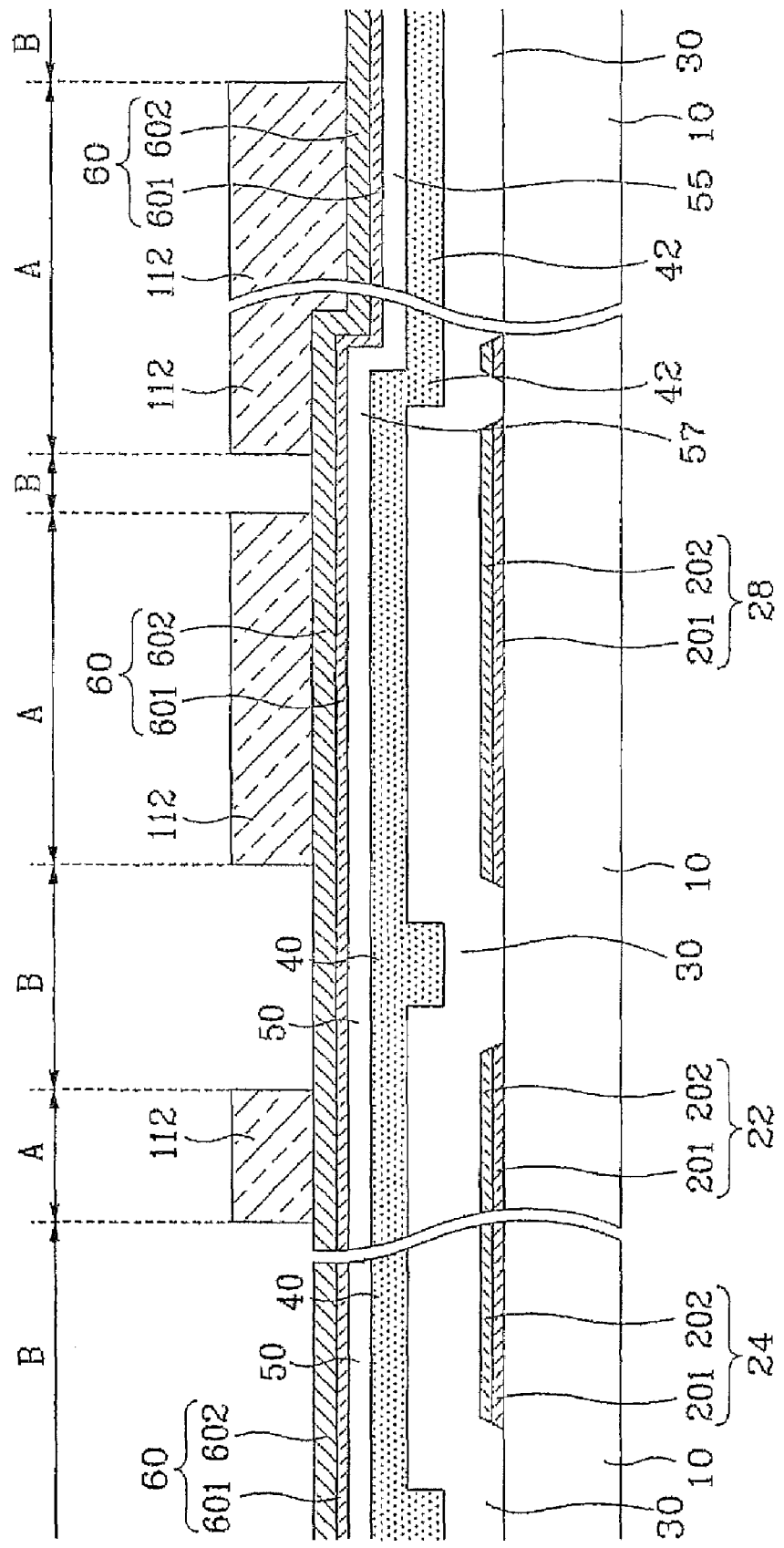
FIGS. 16B and 16C are cross sectional views of the thin film transistor array substrate taken along the XVIb-XVIb' line and the XVIc-XVIc' line of FIG. 16A.
Figure 16C:
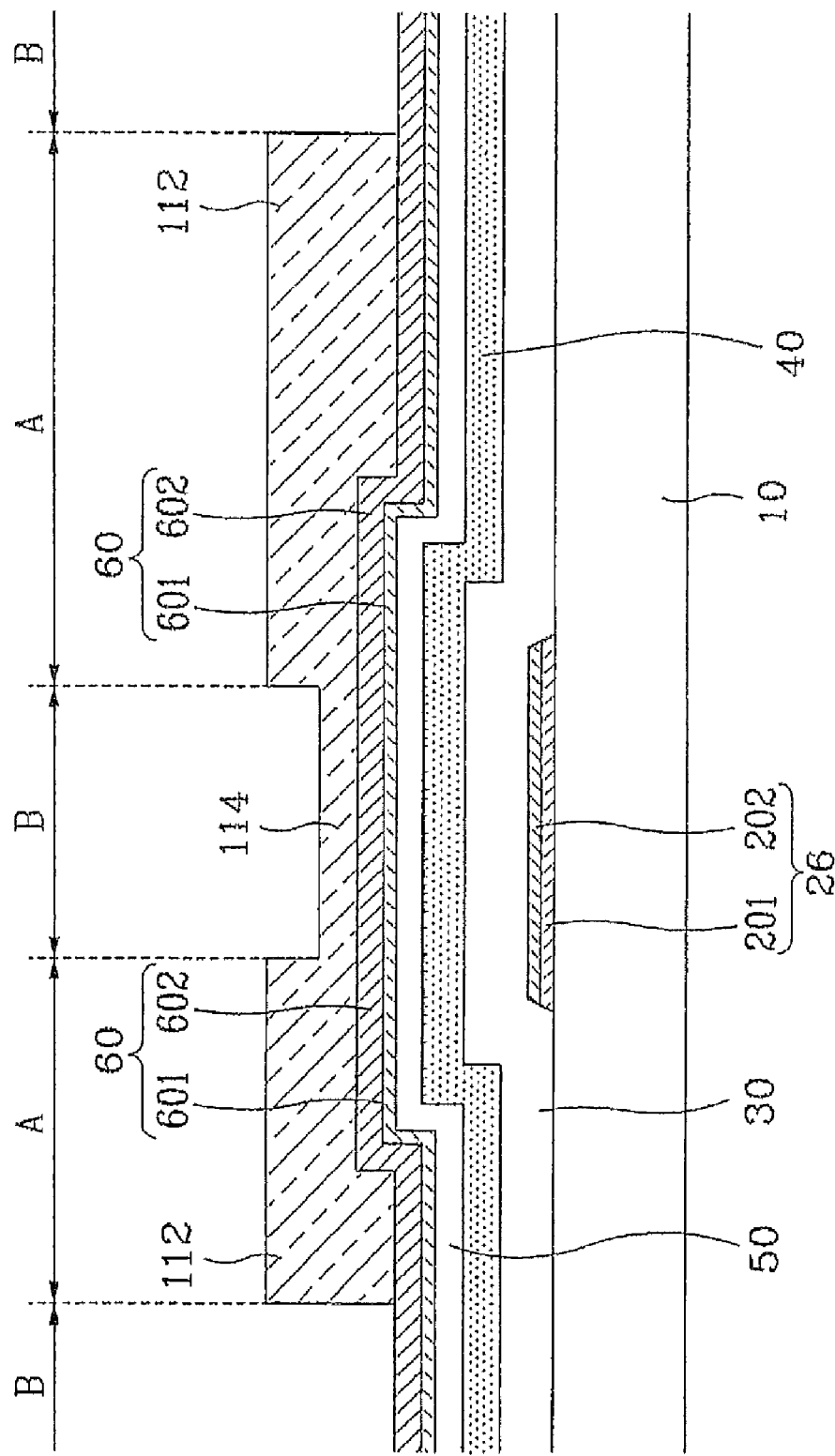

As shown in FIGS. 166 and 16C, the photoresist film 110 is then exposed to light through a second mask, and developed to thereby form a photoresist pattern with first and second pattern portions 114 and 112. The first photoresist pattern portion 114 is placed at the channel area C between the source and the drain electrodes 65 and 66, and the second photoresist pattern portion 112 is placed at the data line assembly area A. The first photoresist pattern portion 114 is established to bear a thickness smaller than that of the second photoresist pattern portion 112. The photoresist film portion at the remaining area B is all removed. The thickness ratio of the first photoresist pattern portion 114 to the second photoresist pattern portion 112 should be controlled to be varied depending upon the etching conditions at the subsequent processing steps. It is preferable that the thickness of the first photoresist pattern portion 114 should be established to be ½ or less of the thickness of the second photoresist pattern portion 112, for instance to be 4000' or less.

In order to differentiate the thickness of the photoresist film, a semi-transmission region may be formed at the mask with a slit or lattice pattern or a semitransparent film.

It is preferable that the patterning width should be smaller than the light decomposition capacity of the light exposing device. In the case of using the semitransparent film, thin films differentiated in the light transmission or the thickness may be used to control the light transmission in the fabrication of a mask.

When a photoresist film is exposed to light using such a mask, the high molecules at the portion of the photoresist film directly exposed to light are entirely decomposed, those at the portion of the photoresist film with a slit pattern or a semitransparent film are decomposed at some degree, and those at the portion of the photoresist film intercepted by a light interception film are not nearly decomposed. When the photoresist film is developed, only the portions of the photoresist film where the high molecules are not decomposed are left over while being differentiated in thickness depending upon the molecular decomposition degree. In case the light exposing time is too long, all of the molecules are liable to be decomposed.

Such a photoresist film 114 with a relatively thin thickness may be formed using a material capable of making re-flow. In this case, the target film is exposed to light using a usual mask with a light transmission region and a light interception region, and developed. The film portion is partially re-flown to the non-film portion.

Thereafter, the photoresist pattern 114, and the underlying conductive layer 60, ohmic contact layer 50 and semiconductor layer 40 are etched. At this time, the data line assembly and the underlying layers are left over at the data line assembly area A, only the semiconductor layer is left over at the channel area C, and all of the conductive layer 60, the ohmic contact layer 50 and the semiconductor layer 40 are removed at the remaining area B while exposing the gate insulating layer 30 to the outside.

Specifically, as shown in FIGS. 14A and 14B, the conductive layer 60 exposed at the B area is removed while exposing the underlying ohmic contact layer 50. In this process, either dry etching or wet etching may be used in condition that the conductive layer 60 is etched while not nearly etching the photoresist patterns 112 and 114. However, in the case of the dry etching, it is difficult to find a condition in that only the conductive layer 60 is etched while not etching the photoresist patterns 112 and 114. Therefore, it may be established that the photoresist patterns 112 and 114 be etched together. In this case, the thickness of the first photoresist pattern portion 114 should be established so large as to prevent the underlying conductive layer 60 from being exposed to the outside through the etching.

In case the conductive layer 60 contains Mo, MoW alloy, Al, Al alloy or Ta, either dry etching or wet etching may be used. However, in the case of Cr, as it is not well removed through the dry etching, wet etching is preferably made with respect to the chrome-based layer while using CeNHO.sub.3 as an etching solution. In case the conductive layer 60 is formed with Mo or MoW through the dry etching, a mixture of $CF_4$ and HCl or $CF_4$ and $O_2$ may be used for the etching gas. In the latter case, the etching ratios thereof with respect to the photoresist film are nearly similar to each other.

Figure 17A:
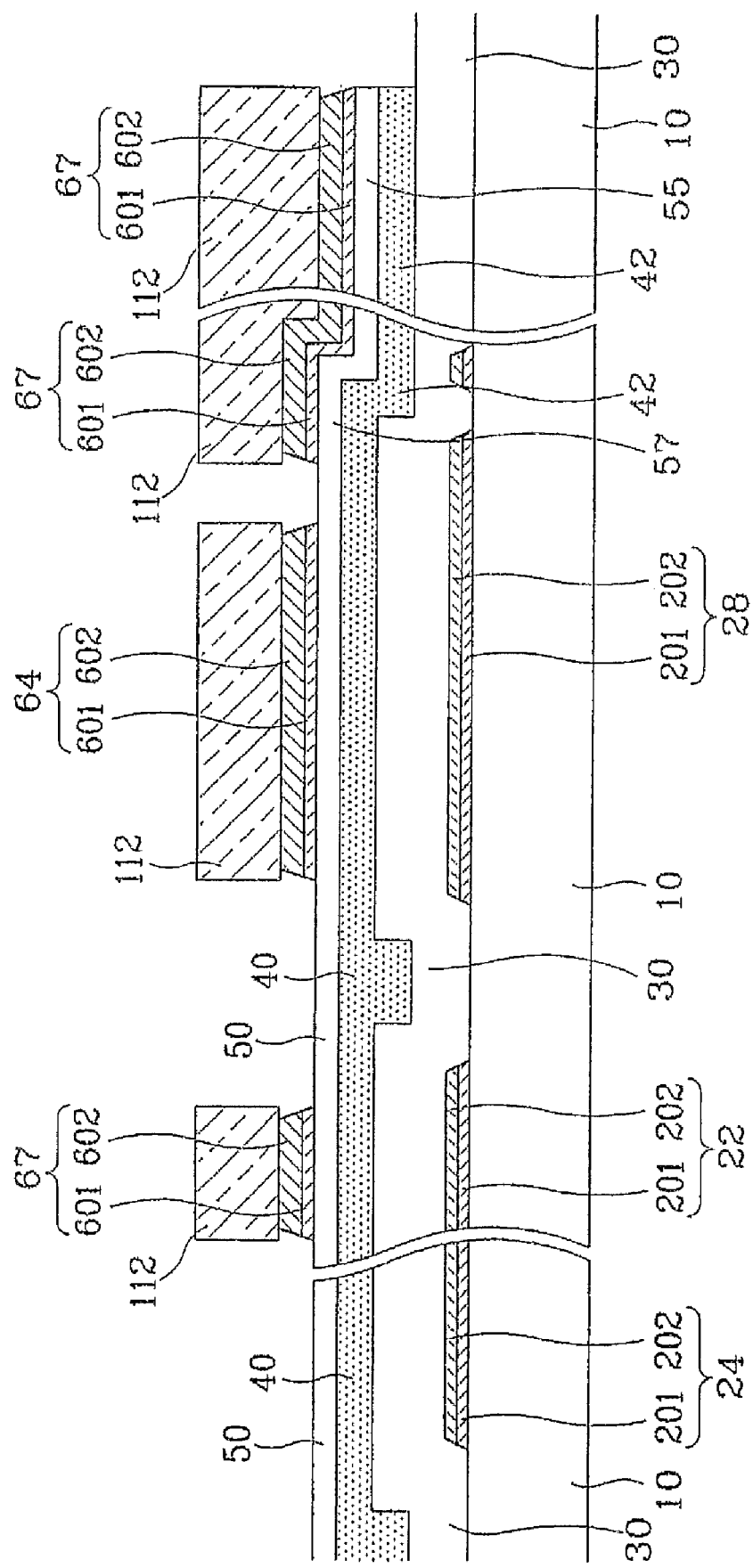

Consequently, as shown in FIGS. 17A and 17B, the source/drain conductive pattern 67 and the storage capacitor conductive pattern 64 are left over at the channel area C and the data line assembly area A, and the conductive layer 60 at the remaining area B is all removed while exposing the underlying ohmic contact layer 50. The conductive patterns 67 and 64 have the same shape as the data line assembly except that the source and the drain electrodes 65 and 66 are connected to each other without separation. Furthermore, in the case of using the dry etching, the photoresist patterns 112 and 114 are also etched by a predetermined thickness.

Figure 18A:
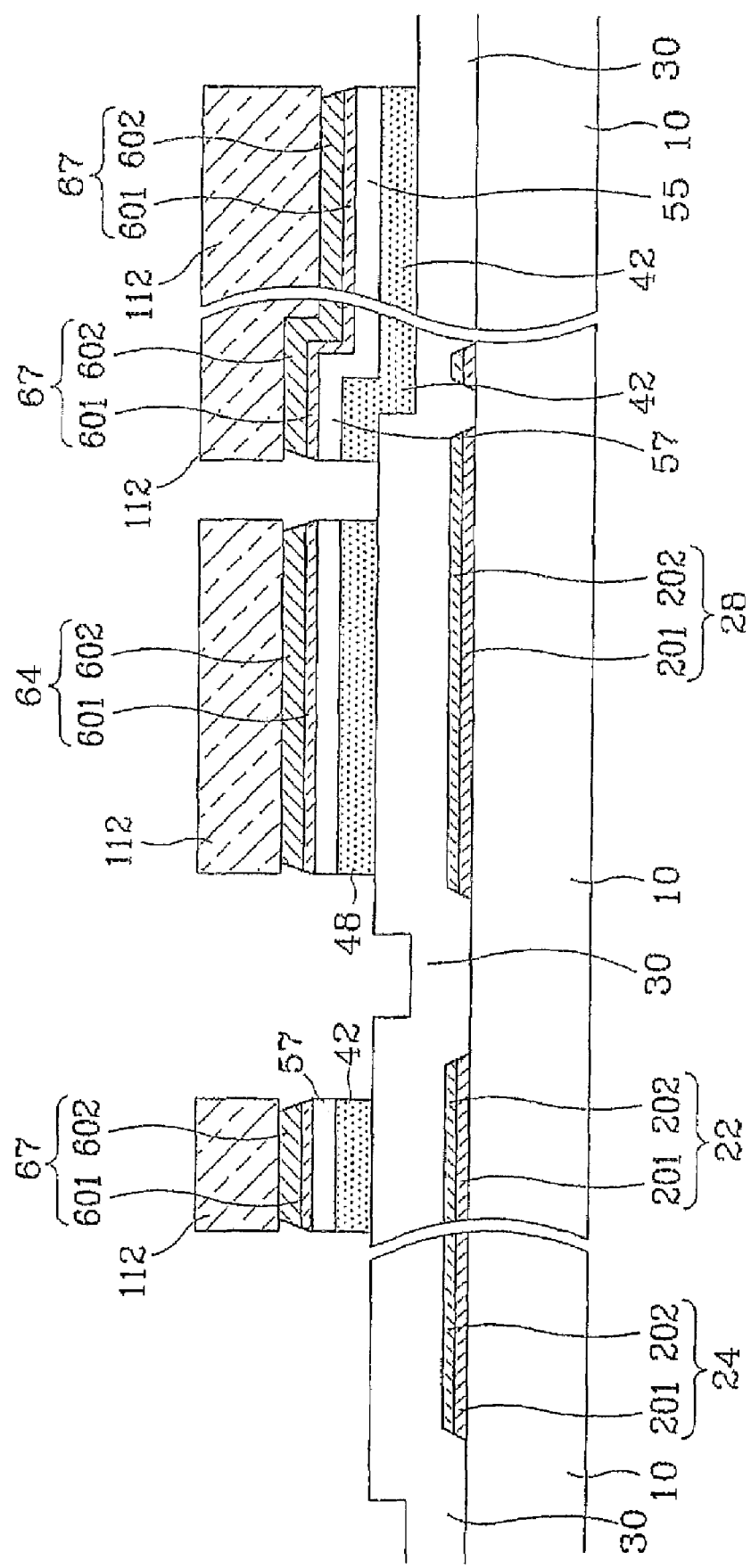
Figure 18B:
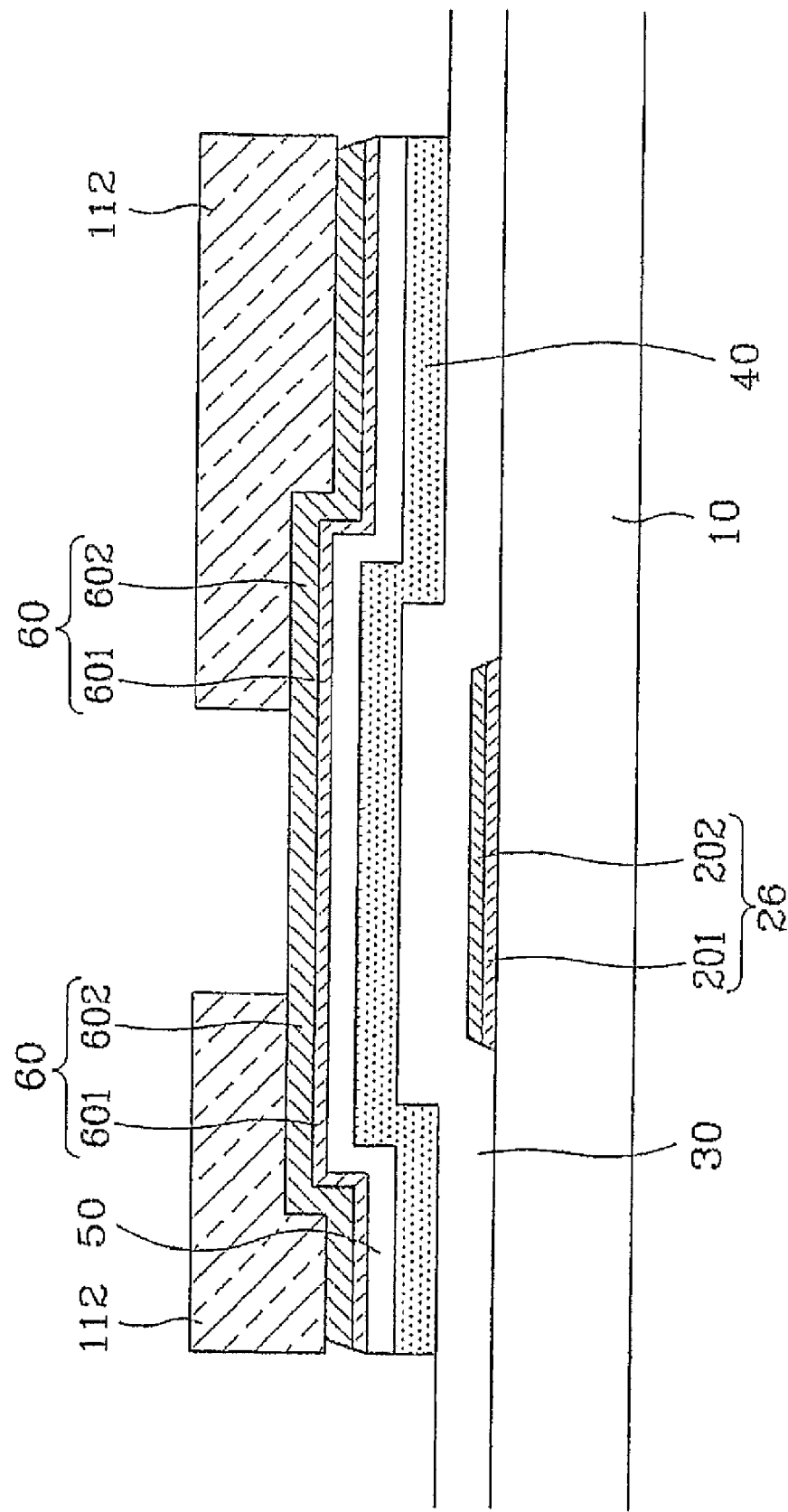

Thereafter, as shown in FIGS. 18A and 18B, the ohmic contact layer 50 exposed at the B area and the underlying semiconductor layer 40 are simultaneously removed through dry etching together with the first photoresist pattern portion 114. The etching with respect to the ohmic contact layer 50 and the semiconductor layer 40 should be made in condition that the photoresist patterns 112 and 114, the ohmic contact layer 50 and the semiconductor layer 40 (the semiconductor layer and the ohmic contact layer having no etching selectivity) are simultaneously etched while not etching the gate insulating layer 30. Particularly, the etching ratios with respect to the photoresist patterns 112 and 114 and the semiconductor layer 40 are preferably established to be the same. For instance, the two layers may be etched by nearly the same thickness using a mixture of $SF_6$ and HCl or $SF_6$ and $O_2$ as the etching gas. In case the etching ratios with respect to the photoresist patterns 112 and 114 and the semiconductor layer are the same, the thickness of the first photoresist pattern portion 114 should be the same as, or less than the sum in thickness of the semiconductor layer 40 and the ohmic contact layer 50.

Consequently, as shown in FIGS. 18A and 18B, the first photoresist pattern portion 114 at the channel area C is removed while exposing the source/drain conductive pattern 67, and the ohmic contact layer 50 and the semiconductor layer 40 at the B area are removed while exposing the underlying gate insulating layer 30 to the outside. Meanwhile, the second photoresist pattern portion 112 at the data line assembly area A is also etched while being reduced in thickness. In this processing step, semiconductor patterns 42 and 48 are completed. Reference numerals 57 and 58 indicate the ohmic contact patterns under the source/drain conductive pattern 67 and the storage capacitor conductive pattern 64, respectively.

The photoresist film residue remained on the surface of the source/drain conductive pattern 67 at the channel area C is removed through ashing.

Figure 19A:
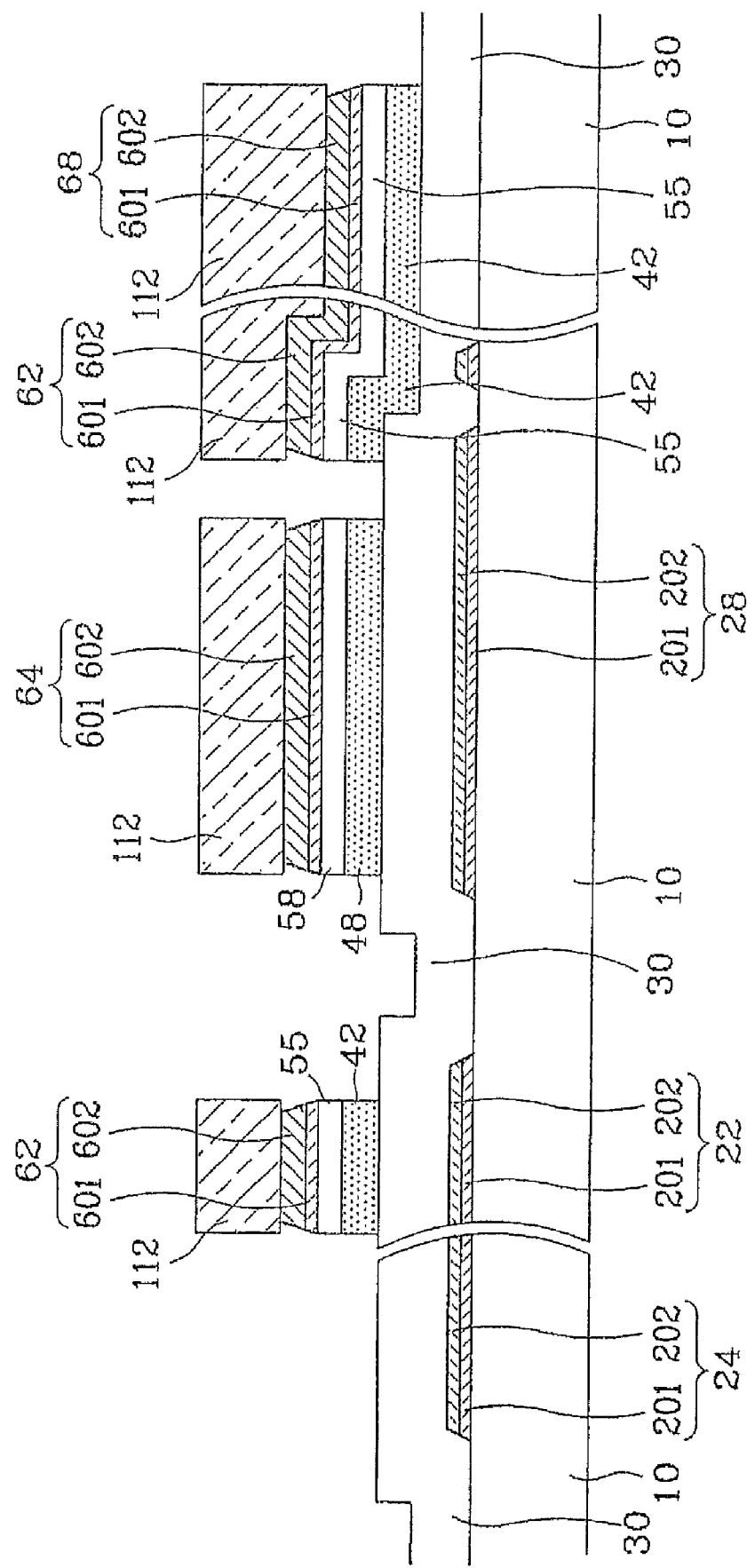
Figure 19B:
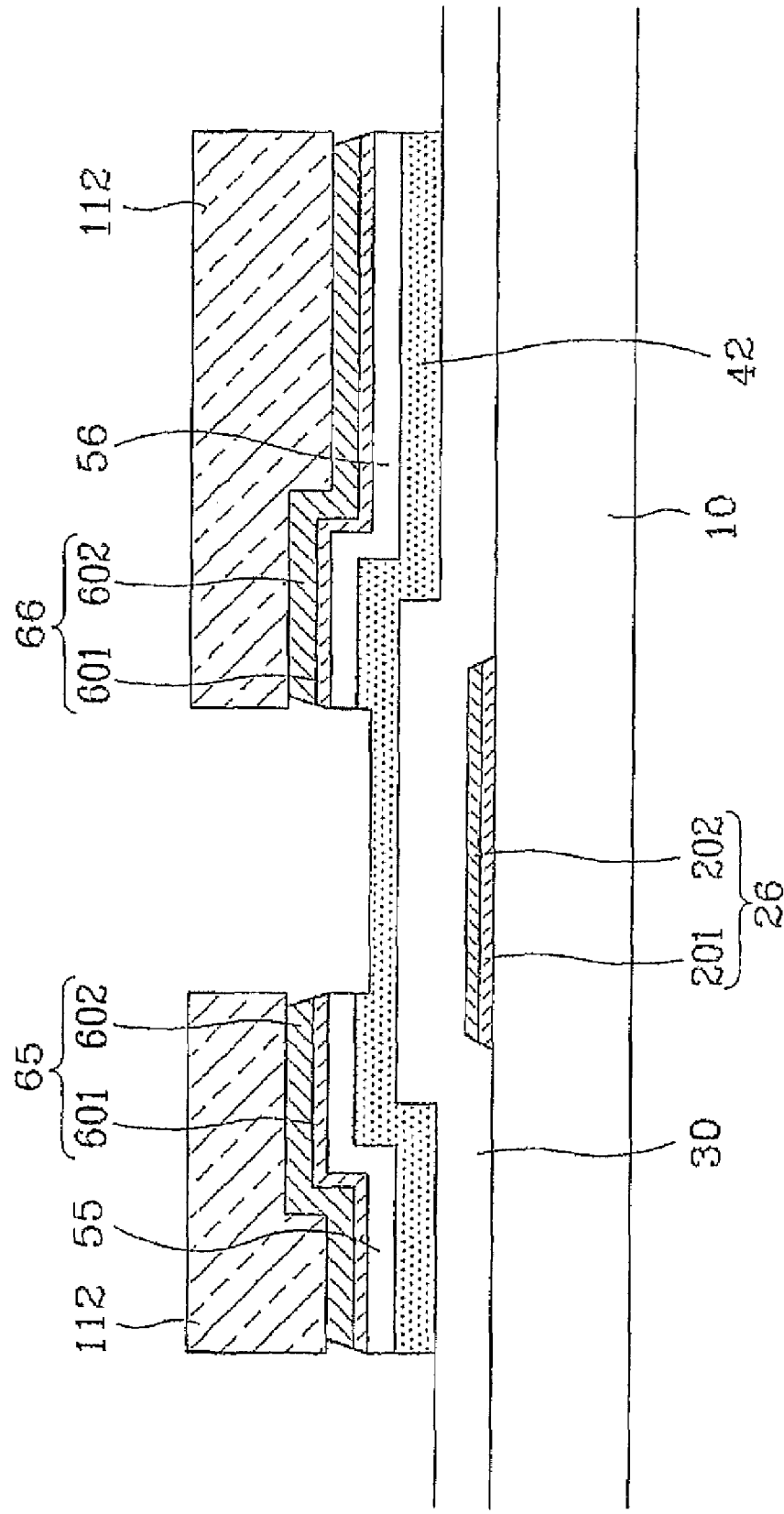

Thereafter, as shown in FIGS. 19A and 19B, the source/drain conductive pattern 67 at the channel area C and the underlying source/drain ohmic contact pattern 57 are removed through etching. Dry etching may be made with respect to both of the source/drain conductive pattern 67 and the ohmic contact pattern 57. Wet etching may be made with respect to the source/drain conductive pattern 67 while applying the dry etching to the ohmic contact pattern 57. In the former case, the etching is preferably made in condition that the etching selection ratio with respect to the source/drain conductive pattern 67 and the ohmic contact pattern 57 is great. In case the etching selection ratio is not great, it becomes difficult to find the final point of etching so that the thickness of the semiconductor pattern 42 to be left over at the channel area C cannot be easily controlled. For instance, the source/drain conductive pattern 67 may be etched using a mixture of $SF_6$ and $O_2$ as an etching gas. In the latter case where the wet etching and the dry etching are alternated, the lateral side of the source/drain conductive pattern 67 suffering the wet etching is removed, but that of the ohmic contact pattern 57 suffering the dry etching is not nearly etched so that a stepped portion is made there. For instance, the ohmic contact pattern 57 and the semiconductor pattern 42 may be etched using a mixture of $CF_4$ and HCl or $CF_4$ and $O_2$ as the etching gas. In case the mixture of $CF_4$ and $O_2$ is used as the etching gas, the semiconductor pattern 42 may bear a uniform thickness. At this time, as shown in FIG. 19B, the semiconductor pattern 42 is partially removed while being reduced in thickness, and the second photoresist pattern portion 112 is etched by a predetermined thickness. The etching should be made in condition that the gate insulating layer 30 is not etched. The photoresist film should be so thick as to prevent the second is photoresist pattern portion 112 from being etched while exposing the underlying data line assembly.

Consequently, the source and the drain electrodes 65 and 66 are separated from each other while completing the data line assembly and the underlying ohmic contact patterns 55, 56 and 58.

Finally, the second photoresist pattern portion 112 remained at the data line assembly area A is removed. However, the removal of the second photoresist pattern portion 112 may be made after the source/drain conductive pattern 67 at the channel area C is removed but before the removal of the underlying ohmic contact pattern 57.

As described above, the wet etching and the dray etching may be alternated, or only the dry etching may be used. In the latter case, the processing steps are simplified but it is difficult to find the suitable etching conditions. By contrast, in the former case, it is relatively easy to find the suitable etching conditions but the processing steps are complicated.

Figure 20A:
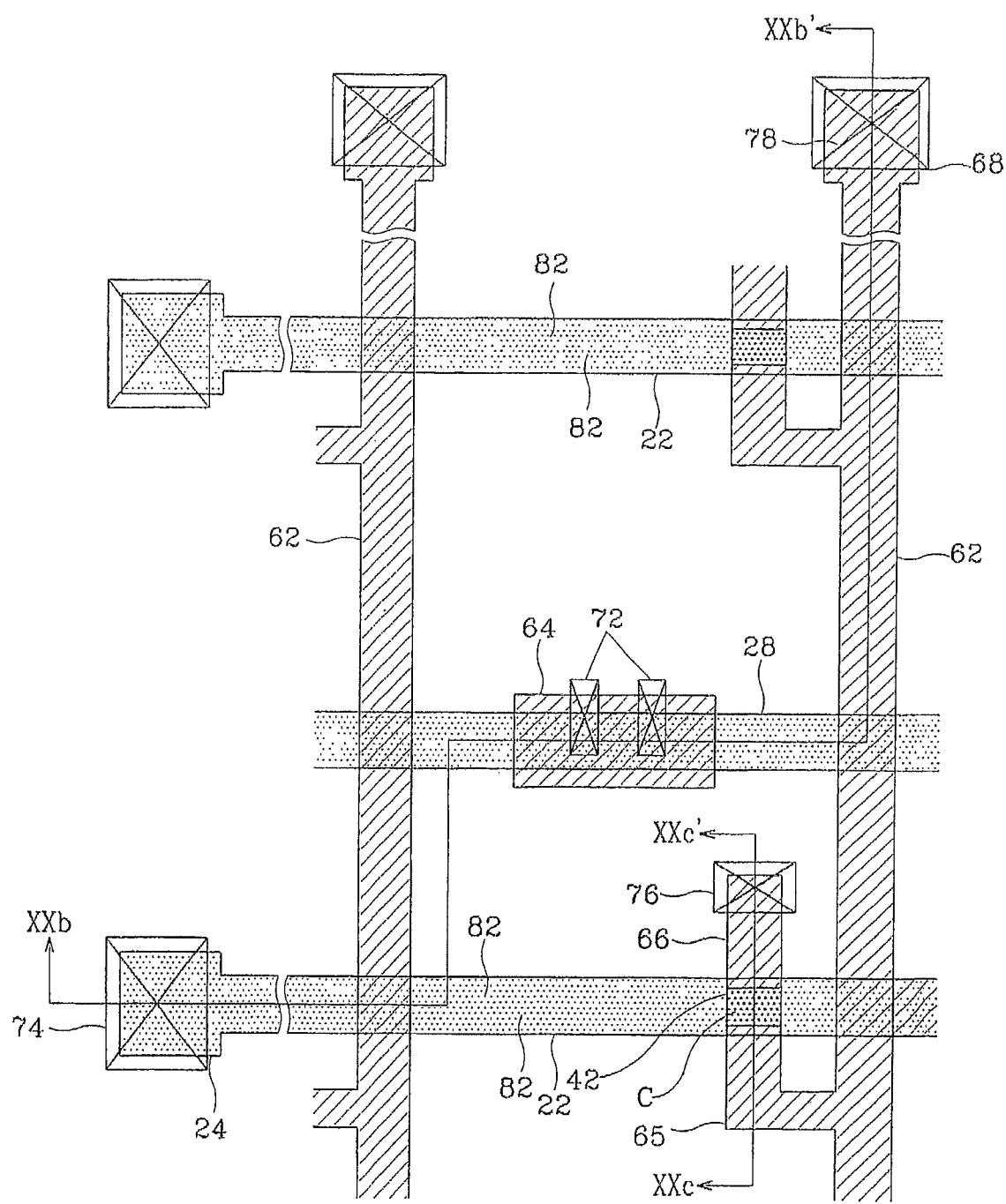
FIG. 20A illustrates the step of fabricating the thin film transistor array substrate following that illustrated in FIGS. 19A and 19B.
Figure 20B:
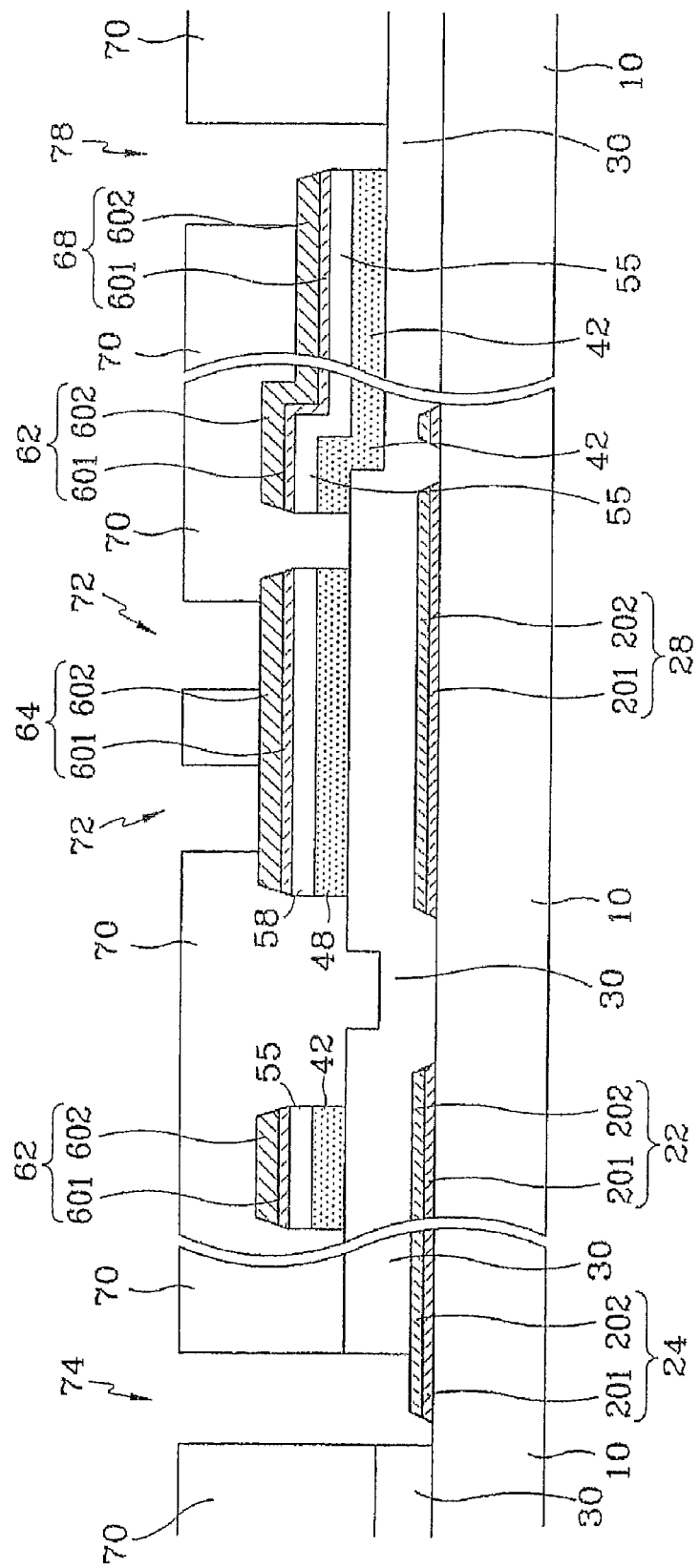
FIGS. 20B and 20C are cross sectional views of the thin film transistor array substrate taken along the XXb-XXb' line and the XXc-XXc' line of FIG. 20A.
Figure 20C:
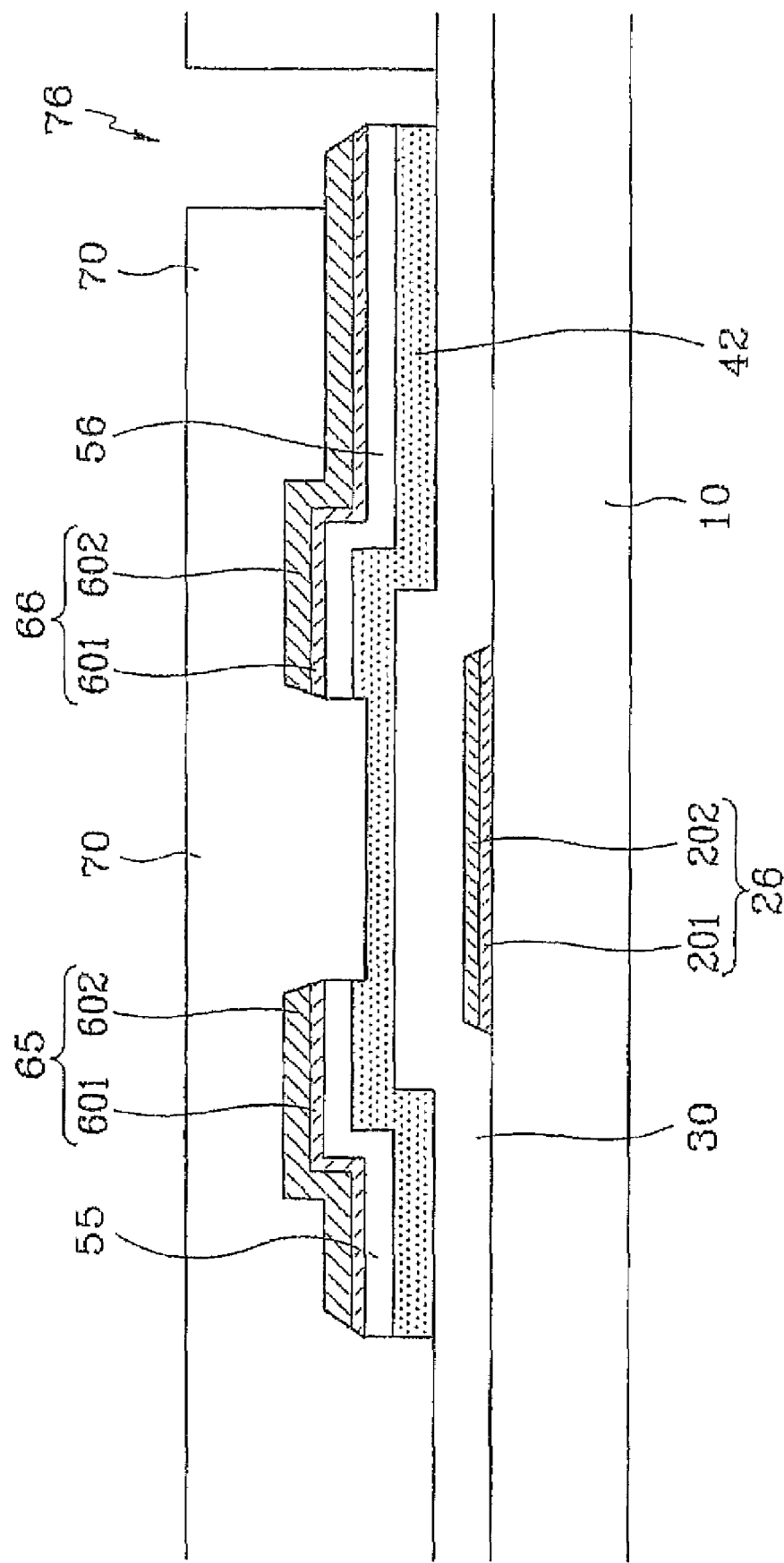

After the data line assembly is formed, as shown in FIGS. 20A and 20B, a silicon nitride layer is deposited through CVD at 250-400° C. to thereby form a protective layer 70. The protective layer 70 is etched together with the gate insulating layer 30 using a third mask, thereby forming contact holes 76, 74, 78 and 72 exposing the under-layers 201 and 601 of the drain electrodes 66, the gate pads 24, the data pads 68, and the storage capacitor conductive patterns 64.

Finally, as shown in FIGS. 11 to 13, an IZO-based layer is deposited onto the substrate 10 through sputtering such that it bears a thickness of 400-500'. The IZO-based layer is etched using a fourth mask to thereby form pixel electrodes 82 connected to the drain electrodes 66 and the storage capacitor conductive patterns 64, subsidiary gate pads 84 connected to the gate pads 24, and subsidiary data pads 88 connected to the data pads 68. The etching solution for patterning the chrome-based layer may be used for patterning the IZO-based layer while preventing the data line assembly or the gate line assembly from being eroded. $HNO_3/(NH_4)_2Ce(NO_3)_6/H_2O$ may be used for the etching solution.

In this preferred embodiment, the data line assembly and the underlying ohmic contact patterns 55, 56 and 58 and semiconductor patterns 42 and 48 are formed using one mask. In this process, the source and the drain electrodes 65 and 66 are separated from each other. In this way, the processing steps can be simplified.

Alternatively, the contact structure illustrated with reference to FIGS. 2A to 3E may be also well applied for use in fabricating the thin film transistor array substrates according the first and the second preferred embodiments. Furthermore, the contact structure illustrated with reference to FIGS. 1A to 3E may be also applied for use in fabricating semiconductor devices with different structures.

As described above, the sidewall of the wiring line assembly at the contact area is exposed to the outside, and the conductive layer contacting the IZO-based layer is established to bear a low contact resistance. In this way, the contact resistance between the wiring line assembly and the IZO-base layer is minimized while ensuring reliability at the contact area. Furthermore, as the wiring line assembly contains a low resistance aluminum or aluminum alloy-based conductive layer, it can be well adapted for use in the wide-screened high definition display device. In addition, the processing steps are simplified while reducing the production cost.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A wiring line contact structure comprising:
   a wiring line assembly including an under-layer and an over-layer, the over-layer having edges located on the under-layer,
   an insulating layer on the wiring line assembly and having a contact hole exposing at least a portion of the under-layer, and
   a conductive layer formed on the insulating layer and contacting both the under-layer and a top surface of over-layer through the contact hole.

2. The wiring line contact structure of claim 1, wherein the contact hole exposes at least one edge of the under-layer.

3. The wiring line contact structure of claim 1, wherein the sidewall of the wiring line assembly has a stepped structure.

4. The wiring line contact structure of claim 1, wherein the conductive layer contacts the top surface of the under-layer through the contact hole.

5. The wiring line contact structure of claim 1, wherein the under-layer comprises Mo, Mo alloy, Cr or Cr alloy.

6. The wiring line contact structure of claim 1, wherein the over-layer comprises Al or Al alloy.

7. The wiring line contact structure of claim 1, wherein the conductive layer comprises ITO or IZO.

8. The wiring line contact structure of claim 1, wherein the edges of the over-layer include at least opposing edges defining the over-layer in a longitudinal direction.

9. The wiring line contact structure of claim 1, wherein the edges of the over-layer include at least opposing edges defining the over-layer in a transverse direction.

10. The wiring line contact structure of claim 1, wherein the edges of the over-layer include all edges defining the over-layer.

* * * * *